(12) United States Patent
Xu et al.

(10) Patent No.: US 9,431,530 B2
(45) Date of Patent: Aug. 30, 2016

(54) SUPER-HIGH DENSITY TRENCH MOSFET

(75) Inventors: Robert Q. Xu, Fremont, CA (US); Kuo-In Chen, Los Altos, CA (US); Karl Lichtenberger, Sunnyvale, CA (US); Sharon Shi, San Jose, CA (US); Qufei Chen, San Jose, CA (US); Kyle Terrill, Santa Clara, CA (US)

(73) Assignee: Vishay-Siliconix, Santa Clara, CA (US)

( * ) Notice: Subject to any disclaimer, the term of this patent is extended or adjusted under 35 U.S.C. 154(b) by 866 days.

(21) Appl. No.: 12/788,158

(22) Filed: May 26, 2010

(65) Prior Publication Data

US 2011/0089486 A1  Apr. 21, 2011

Related U.S. Application Data

(60) Provisional application No. 61/253,464, filed on Oct. 20, 2009.

(51) Int. Cl.
| | | |
|---|---|---|
| H01L 21/336 | (2006.01) | |
| H01L 29/792 | (2006.01) | |
| H01L 29/78 | (2006.01) | |
| H01L 29/66 | (2006.01) | |
| H01L 21/265 | (2006.01) | |

(Continued)

(52) U.S. Cl.
CPC ..... *H01L 29/7813* (2013.01); *H01L 29/66734* (2013.01); *H01L 29/7811* (2013.01); *H01L 21/26586* (2013.01); *H01L 29/0638* (2013.01); *H01L 29/407* (2013.01); *H01L 29/42368* (2013.01)

(58) Field of Classification Search
CPC .................................................. H01L 29/7813
USPC ......... 438/279–282, 302, 268; 257/328–330, 257/E29.277–E29.279
See application file for complete search history.

(56) References Cited

U.S. PATENT DOCUMENTS

| 3,906,540 A | 9/1975 | Hollins |
|---|---|---|
| 4,641,174 A | 2/1987 | Baliga |

(Continued)

FOREIGN PATENT DOCUMENTS

| DE | 4 208 695 A1 | 9/1992 |
|---|---|---|
| DE | 102004036330 | 3/2005 |

(Continued)

OTHER PUBLICATIONS

Masakatsu Hoshi et al., "A DMOSFET Having A Cell Array Field Ring for Improving Avalanche Capability", May 18, 1993, IEEE, Proceedings of the 5th International Symposium on Power Semiconductor Devices and ICs (ISPSD), Monterey, California, May 18-20, 1993, pp. 141-145, XP000380145.

(Continued)

*Primary Examiner* — Calvin Lee

(57) ABSTRACT

A method, in one embodiment, can include forming a plurality of trenches in a body region for a vertical metal-oxide semiconductor field-effect transistor (MOSFET). In addition, the method can include angle implanting source regions into the body region. Furthermore, dielectric material can be grown within the plurality of trenches. Gate polysilicon can be deposited within the plurality of trenches. Moreover, the method can include chemical mechanical polishing the gate polysilicon. The method can also include etching back the gate polysilicon within the plurality of trenches.

15 Claims, 14 Drawing Sheets

(51) Int. Cl.
*H01L 29/06* (2006.01)
*H01L 29/40* (2006.01)
*H01L 29/423* (2006.01)

(56) References Cited

U.S. PATENT DOCUMENTS

| | | | |
|---|---|---|---|
| 4,672,407 A | 6/1987 | Nakagawa et al. |
| 4,782,372 A | 11/1988 | Nakagawa et al. |
| 4,799,095 A | 1/1989 | Baliga |
| 4,823,172 A | 4/1989 | Mihara |
| 4,827,321 A | 5/1989 | Baliga |
| 4,857,986 A | 8/1989 | Kinugawa |
| 4,928,155 A | 5/1990 | Nakagawa et al. |
| 4,939,557 A | 7/1990 | Pao et al. |
| 4,967,243 A | 10/1990 | Baliga et al. |
| 4,969,027 A | 11/1990 | Baliga et al. |
| 5,021,840 A | 6/1991 | Morris |
| 5,055,896 A | 10/1991 | Williams et al. |
| 5,072,266 A | 12/1991 | Bulucea et al. |
| 5,111,253 A | 5/1992 | Korman et al. |
| 5,168,331 A | 12/1992 | Yilmaz |
| 5,191,395 A | 3/1993 | Nishimura |
| 5,221,850 A | 6/1993 | Sakurai |
| 5,233,215 A | 8/1993 | Baliga |
| 5,245,106 A | 9/1993 | Cameron et al. |
| 5,366,914 A | 11/1994 | Takahashi et al. |
| 5,378,655 A | 1/1995 | Hutchings et al. |
| 5,387,528 A | 2/1995 | Hutchings et al. |
| 5,430,315 A | 7/1995 | Rumennik |
| 5,525,821 A | 6/1996 | Harada et al. |
| 5,527,720 A | 6/1996 | Goodyear et al. |
| 5,567,634 A | 10/1996 | Hebert et al. |
| 5,578,508 A * | 11/1996 | Baba et al. ............... 438/270 |
| 5,602,424 A | 2/1997 | Tsubouchi et al. |
| 5,621,234 A | 4/1997 | Kato |
| 5,648,283 A | 7/1997 | Tsang et al. |
| 5,689,128 A | 11/1997 | Hshieh |
| 5,696,396 A | 12/1997 | Tokura et al. |
| 5,770,878 A | 6/1998 | Beasom |
| 5,808,340 A | 9/1998 | Wollesen et al. |
| 5,814,858 A | 9/1998 | Williams |
| 5,877,538 A | 3/1999 | Williams |
| 5,965,904 A | 10/1999 | Ohtani et al. |
| 5,998,836 A | 12/1999 | Williams |
| 5,998,837 A | 12/1999 | Williams |
| 6,049,108 A | 4/2000 | Williams et al. |
| 6,096,584 A | 8/2000 | Ellis-Monaghan et al. |
| 6,140,678 A | 10/2000 | Grabowski et al. |
| 6,153,896 A | 11/2000 | Omura et al. |
| 6,168,996 B1 | 1/2001 | Numazawa et al. |
| 6,172,398 B1 | 1/2001 | Hshieh |
| 6,180,966 B1 | 1/2001 | Kohno et al. |
| 6,204,533 B1 | 3/2001 | Williams et al. |
| 6,211,018 B1 | 4/2001 | Nam et al. |
| 6,238,981 B1 | 5/2001 | Grebs |
| 6,245,615 B1 | 6/2001 | Noble et al. |
| 6,268,242 B1 | 7/2001 | Williams et al. |
| 6,277,695 B1 | 8/2001 | Williams et al. |
| 6,285,060 B1 | 9/2001 | Korec et al. |
| 6,348,712 B1 | 2/2002 | Korec et al. |
| 6,351,009 B1 | 2/2002 | Kocon et al. |
| 6,359,308 B1 | 3/2002 | Hijzen et al. |
| 6,391,721 B2 | 5/2002 | Nakagawa |
| 6,413,822 B2 | 7/2002 | Williams et al. |
| 6,483,171 B1 | 11/2002 | Forbes et al. |
| 6,489,204 B1 | 12/2002 | Tsui |
| 6,495,883 B2 | 12/2002 | Shibata et al. |
| 6,498,071 B2 | 12/2002 | Hijzen et al. |
| 6,580,123 B2 | 6/2003 | Thapar |
| 6,580,154 B2 | 6/2003 | Noble et al. |
| 6,642,109 B2 | 11/2003 | Lee et al. |
| 6,661,054 B1 | 12/2003 | Nakamura |
| 6,700,158 B1 | 3/2004 | Cao et al. |
| 6,710,403 B2 | 3/2004 | Sapp |
| 6,717,210 B2 | 4/2004 | Takano et al. |
| 6,756,274 B2 | 6/2004 | Williams et al. |
| 6,770,539 B2 | 8/2004 | Sumida |
| 6,825,105 B2 | 11/2004 | Grover et al. |
| 6,861,701 B2 | 3/2005 | Williams et al. |
| 6,903,393 B2 | 6/2005 | Ohmi et al. |
| 6,919,610 B2 | 7/2005 | Saitoh et al. |
| 6,927,455 B2 | 8/2005 | Narazaki |
| 6,960,821 B2 | 11/2005 | Noble et al. |
| 6,987,305 B2 | 1/2006 | He et al. |
| 7,224,022 B2 * | 5/2007 | Tokano et al. ............... 257/328 |
| 7,361,952 B2 | 4/2008 | Miura et al. |
| 7,375,029 B2 | 5/2008 | Poelzl |
| 7,397,083 B2 | 7/2008 | Amali et al. |
| 7,449,354 B2 * | 11/2008 | Marchant et al. ............... 438/39 |
| 7,521,306 B2 | 4/2009 | Kubo et al. |
| 7,541,642 B2 | 6/2009 | Kawamura et al. |
| 7,544,568 B2 | 6/2009 | Matsuura et al. |
| 7,663,195 B2 | 2/2010 | Ohmi et al. |
| 7,910,486 B2 * | 3/2011 | Yilmaz et al. ............... 438/700 |
| 7,964,913 B2 * | 6/2011 | Darwish ............... 257/330 |
| 8,080,459 B2 | 12/2011 | Xu |
| 2001/0026006 A1 | 10/2001 | Noble et al. |
| 2001/0026989 A1 | 10/2001 | Thapar |
| 2002/0036319 A1 | 3/2002 | Baliga |
| 2002/0038887 A1 | 4/2002 | Ninomiya et al. |
| 2002/0074585 A1 | 6/2002 | Tsang et al. |
| 2002/0123196 A1 | 9/2002 | Chang et al. |
| 2002/0130359 A1 | 9/2002 | Okumura et al. |
| 2003/0030092 A1 | 2/2003 | Darwish et al. |
| 2003/0201483 A1 | 10/2003 | Sumida |
| 2004/0021174 A1 | 2/2004 | Kobayashi |
| 2004/0155287 A1 | 8/2004 | Omura et al. |
| 2004/0161886 A1 | 8/2004 | Forbes et al. |
| 2004/0173844 A1 | 9/2004 | Williams et al. |
| 2005/0001268 A1 | 1/2005 | Baliga |
| 2005/0026369 A1 | 2/2005 | Noble et al. |
| 2005/0029585 A1 | 2/2005 | He et al. |
| 2005/0079678 A1 | 4/2005 | Verma et al. |
| 2005/0266642 A1 | 12/2005 | Kubo et al. |
| 2006/0014349 A1 | 1/2006 | Williams et al. |
| 2006/0108635 A1 | 5/2006 | Bhalla et al. |
| 2006/0113577 A1 | 6/2006 | Ohtani |
| 2006/0113588 A1 | 6/2006 | Wu |
| 2006/0226494 A1 | 10/2006 | Hshieh |
| 2006/0267090 A1 | 11/2006 | Sapp et al. |
| 2006/0273383 A1 | 12/2006 | Hshieh |
| 2006/0285368 A1 | 12/2006 | Schlecht |
| 2007/0013000 A1 | 1/2007 | Shiraishi |
| 2007/0023828 A1 | 2/2007 | Kawamura et al. |
| 2007/0155104 A1 | 7/2007 | Marchant et al. |
| 2008/0099344 A9 | 5/2008 | Basol et al. |
| 2008/0135931 A1 | 6/2008 | Challa et al. |
| 2008/0164515 A1 | 7/2008 | Li |
| 2008/0185640 A1 | 8/2008 | Nakagawa |
| 2008/0246081 A1 | 10/2008 | Li et al. |
| 2009/0159963 A1 | 6/2009 | Yamaguchi et al. |
| 2009/0166740 A1 | 7/2009 | Bhalla et al. |
| 2010/0055892 A1 | 3/2010 | Poelzl |
| 2010/0059797 A1 | 3/2010 | Ngai et al. |
| 2010/0181606 A1 | 7/2010 | Takaishi |
| 2011/0049614 A1 | 3/2011 | Gao et al. |
| 2011/0053326 A1 | 3/2011 | Gao et al. |
| 2012/0187474 A1 | 7/2012 | Rexer et al. |
| 2012/0313161 A1 | 12/2012 | Grivna et al. |
| 2012/0326229 A1 | 12/2012 | Poelzl et al. |

FOREIGN PATENT DOCUMENTS

| | | |
|---|---|---|
| DE | 112005003584 | 4/2008 |
| EP | 0 133 642 A1 | 3/1985 |
| EP | 0354449 | 2/1990 |
| EP | 0 438 700 A1 | 7/1991 |
| EP | 0 583 022 A2 | 2/1994 |
| EP | 0 583 028 A1 | 2/1994 |
| EP | 0620588 | 10/1994 |
| EP | 0628337 | 12/1994 |
| EP | 0 746 030 A2 | 12/1996 |
| EP | 1 033 759 A2 | 9/2000 |
| EP | 1186023 | 3/2002 |

(56) References Cited

FOREIGN PATENT DOCUMENTS

| | | |
|---|---|---|
| GB | 2 269 050 A | 1/1994 |
| JP | 62-298152 | 12/1987 |
| JP | H05-315620 | 11/1993 |
| JP | H06-350090 | 12/1994 |
| JP | H06350090 A | 12/1994 |
| JP | H09-260645 | 10/1997 |
| JP | H10-214809 | 8/1998 |
| JP | 2000-332246 | 11/2000 |
| JP | 2002016080 | 1/2002 |
| JP | 2002110978 | 4/2002 |
| JP | 2002-222950 | 8/2002 |
| JP | 2003030396 | 1/2003 |
| JP | 2003-515954 | 5/2003 |
| JP | 2003-324196 | 11/2003 |
| JP | 2004-522319 | 7/2004 |
| JP | 2005-142240 | 6/2005 |
| JP | 2005-524970 | 8/2005 |
| JP | 2005-268679 | 9/2005 |
| JP | 2007027561 | 2/2007 |
| JP | 2008-042056 | 2/2008 |
| JP | 2009-004411 | 1/2009 |
| JP | 2009-522807 | 6/2009 |
| TW | 490853 B | 6/2002 |
| TW | I302028 B | 10/2008 |
| WO | 0065646 | 11/2000 |
| WO | 0141206 | 6/2001 |
| WO | 0199177 | 12/2001 |
| WO | 03010812 | 2/2003 |
| WO | 2004105116 | 12/2004 |
| WO | 2006058210 | 6/2006 |
| WO | 2006126998 | 11/2006 |
| WO | 2007002857 | 1/2007 |
| WO | 2008156071 A1 | 12/2008 |

OTHER PUBLICATIONS

"Effects on Selecting Channel Direction in Improving Performance of Sub-100 nm MOSFETs Fabricated on (110) Surface Si Substrate" Japanese Journal of Applied Physics, Part 1, Vol. 43, No. 4B, Apr. 2004 pp. 1723-1728 (Nakamura et al.), XP00122768.

* cited by examiner

1400

SUPER-HIGH DENSITY TRENCH MOSFET

CROSS-REFERENCE TO RELATED APPLICATIONS

This application claims the benefit of U.S. Provisional Application No. 61/253,464 entitled "Super-High Density Power Trench MOSFET with Recessed Gated and Trench Edge Termination", by Robert Q. Xu et al., filed Oct. 20, 2009, which is hereby incorporated by reference.

BACKGROUND

For a conventional trench metal-oxide semiconductor field-effect transistor (MOSFET), it can be desirable to increase its trench packing density. However, as the trench packing density of a conventional trench MOSFET continues to increase, it becomes more difficult to fabricate that type of conventional trench MOSFET. For example, it becomes more challenging to print the very narrow trenches utilizing photolithography. Furthermore, it becomes more difficult to insert materials within the very narrow trenches while fabricating this type of conventional trench MOSFET. Additionally, it becomes more problematic to make certain electrical contacts properly align in order to avoid making an electrical short.

SUMMARY

A method, in one embodiment, can include forming a plurality of trenches in a body region for a vertical metal-oxide semiconductor field-effect transistor (MOSFET). In addition, the method can include angle implanting source regions into the body region. Furthermore, dielectric material can be grown within the plurality of trenches. Gate polysilicon can be deposited within the plurality of trenches. Moreover, the method can include chemical mechanical polishing the gate polysilicon. The method can also include etching back the gate polysilicon within the plurality of trenches.

In another embodiment, a method can include forming an edge termination trench in an epitaxial region of a device. Dielectric material can be deposited within the edge termination trench. Furthermore, polysilicon can be deposited within the edge termination trench. Additionally, the method can include chemical mechanical polishing the polysilicon. Also, the method can include etching back the polysilicon within the edge termination trench.

In yet another embodiment, a device can include a plurality of trenches within a body region for a vertical MOSFET. The plurality of trenches each can include a gate polysilicon encompassed by a dielectric material. The upper surface of the dielectric material is planarized. In addition, the device can include a source contact and a plurality of mesas that define the plurality of trenches. Each of the plurality of mesas includes a source region contacting the source contact.

While particular embodiments in accordance with the invention have been specifically described within this Summary, it is noted that the invention and the claimed subject matter are not limited in any way by these embodiments.

BRIEF DESCRIPTION OF THE DRAWINGS

Embodiments of the invention are illustrated by way of example and not by way of limitation in the accompanying drawings and in which like reference numerals refer to similar elements.

The drawings referred to in this description should not be understood as being drawn to scale except if specifically noted.

DETAILED DESCRIPTION

Reference will now be made in detail to various embodiments in accordance with the invention, examples of which are illustrated in the accompanying drawings. While the invention will be described in conjunction with various embodiments, it will be understood that these various embodiments are not intended to limit the invention. On the contrary, the invention is intended to cover alternatives, modifications and equivalents, which may be included within the scope of the invention as construed according to the Claims. Furthermore, in the following detailed description of various embodiments in accordance with the invention, numerous specific details are set forth in order to provide a thorough understanding of the invention. However, it will be evident to one of ordinary skill in the art that the invention may be practiced without these specific details. In other instances, well known methods, procedures, components, and devices have not been described in detail as not to unnecessarily obscure aspects of the invention.

Figure 1:
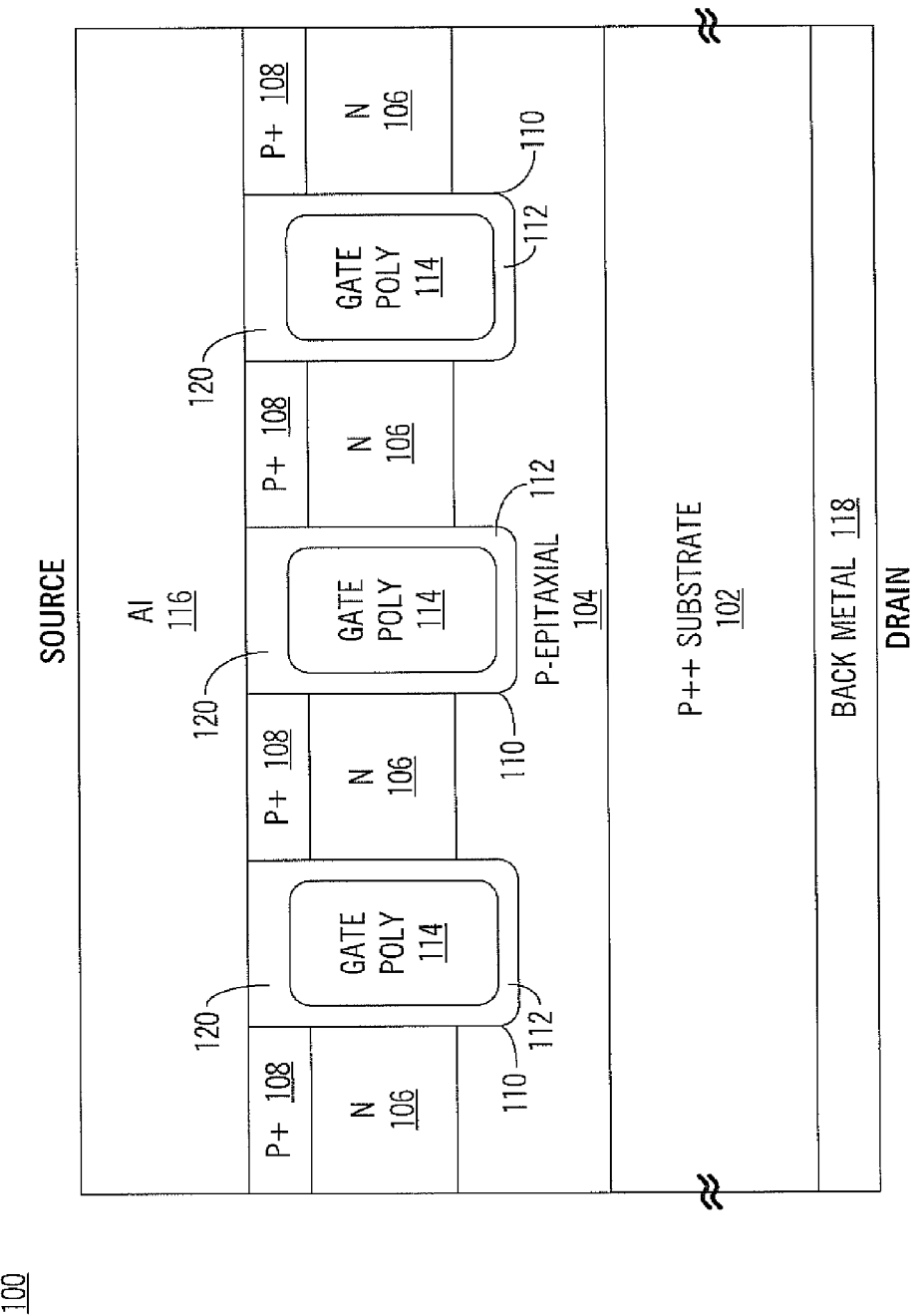
FIG. 1 is a side sectional view of a super-high density P-channel recessed gate power trench MOSFET in accordance with various embodiments of the invention.

FIG. 1 is a side sectional view of a P-channel recessed gate power trench metal-oxide semiconductor field-effect transistor (MOSFET) 100 in accordance with various embodiments of the invention. In one embodiment, it is noted that the P-channel recessed gate power trench MOSFET 100 can be fabricated by utilizing polysilicon chemical mechanical polishing (CMP), polysilicon etch back, and dielectric material CMP planarization techniques in order to avoid surface topology issues. Note that by applying these techniques, a super-high density MOSFET gate channel width of the P-channel power trench MOSFET 100 can be achieved with advanced photolithographic printing. In an embodiment, a super-high density trench MOSFET can include at least 1 giga (or $1 \times 10^9$) cells within 20 square millimeters (mm), but is not limited to such. In addition, due to the recessed gate 114 of the P-channel power trench MOSFET 100, its source contact 116 can be self-aligned to the top source silicon surface 108. Furthermore, due to the very high packing trench density of the P-channel power trench MOSFET 100, it provides a way to make both enhanced-mode MOSFET devices and depletion-mode MOSFET devices by controlling body doping inside the very thin silicon mesa located between trenches 110.

Specifically within one embodiment, the structure of the P-channel power trench MOSFET 100 has the recessed polysilicon gate 114 for its active area. It is pointed out that the recessed polysilicon gate 114 can be created by chemical mechanical polishing its polysilicon and then performing a polysilicon etch back. By utilizing the chemical mechanical polishing of the polysilicon gate 114 plus recessed polysilicon etch back, the upper polysilicon surface of the vertical polysilicon gate 114 is flatter and can be more precisely controlled. The recessed polysilicon gate 114 of the super-high density trench MOSFET 100 can be isolated from the source 116 by a buried dielectric material 120, such as but not limited to, silicon dioxide ($SiO_2$), low temperature oxide (LTO), sub-atmospheric chemical vapor deposition (SACVD) oxide, and the like. It is noted that in one embodiment, the buried dielectric material isolation 120 can be created by utilizing a dielectric material chemical mechanical polishing process. Additionally, the buried dielectric material isolation 120 enables the top silicon surface 108 to be the source, so the source contact 116 can be self-aligned to the top silicon surface 108 and the active trench gate 114 can be packed more densely than conventional trench MOSFETs.

Within FIG. 1, in one embodiment, the super high density P-channel power trench MOSFET 100 can include a very low resistivity (P++) substrate 102 having a P− epitaxial region or layer 104 formed thereon. In addition, an N body region or layer 106 can be implanted into an upper portion of the P− epitaxial layer 104. Furthermore, the super-high density power trench MOSFET 100 can include a P+ source region or layer 108 implanted into an upper portion of the N body region 106. The power trench MOSFET 100 can also include trenches 110 located within the P+ source layer 108, the N body layer 106, and the P− epitaxial layer 104. Additionally, the trenches 110 can include the polysilicon gates 114 encompassed by dielectric material 112 and dielectric material 120. The power trench MOSFET 100 can also include a source metal region or layer 116 deposited on or above the P+ source layer 108. Moreover, the power trench MOSFET 100 can include a drain metal or back metal 118 deposited on or above the P++ substrate 102.

It is noted that the super high density P-channel power trench MOSFET 100 may not include all of the elements illustrated by FIG. 1. Additionally, the super high density power trench MOSFET 100 can be implemented to include one or more elements not illustrated by FIG. 1. It is pointed out that the super high density power trench MOSFET 100 can be utilized or implemented in any manner similar to that described herein, but is not limited to such.

Figure 2:
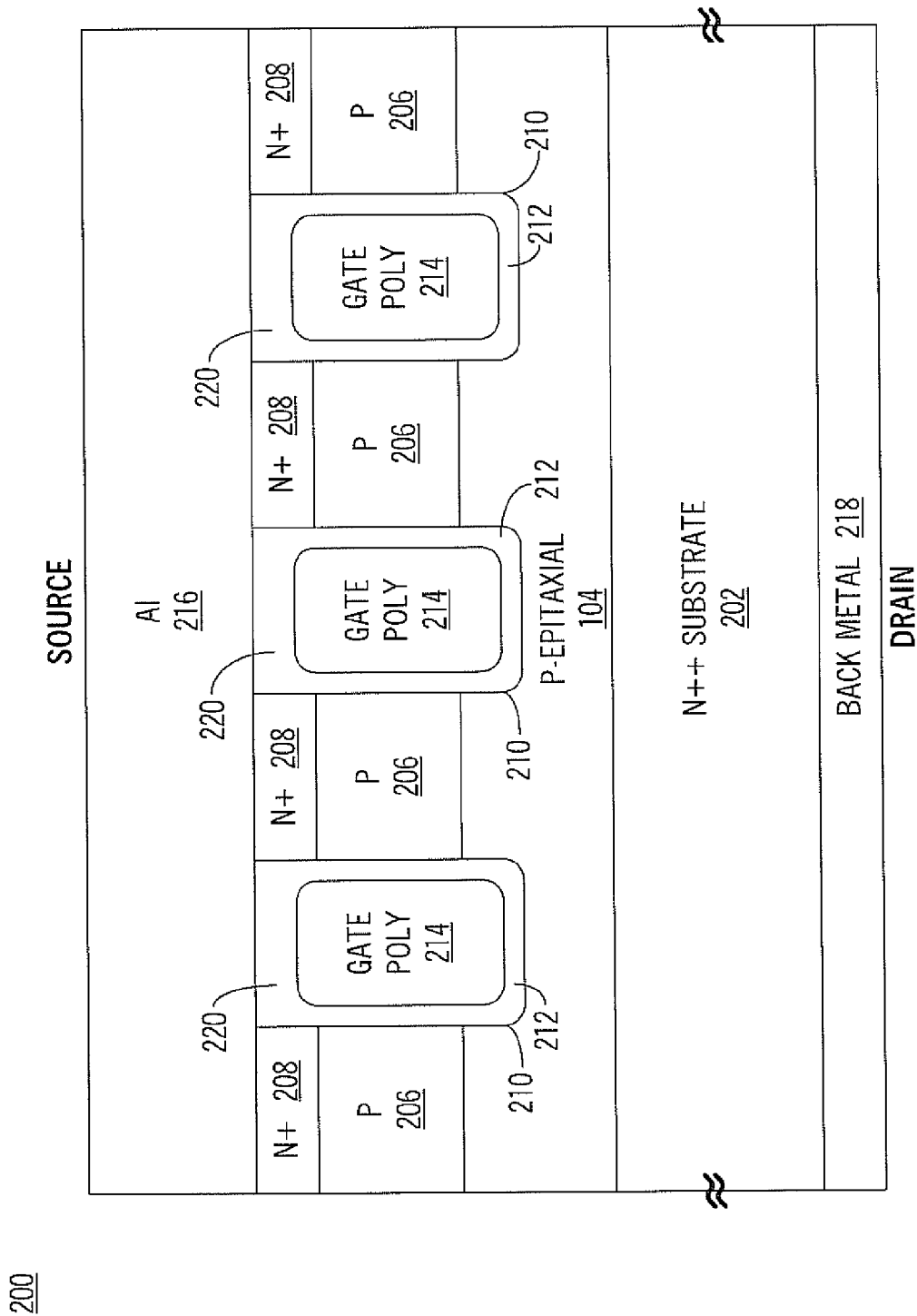
FIG. 2 is a side sectional view of a super-high density N-channel recessed gate power trench MOSFET in accordance with various embodiments of the invention.

FIG. 2 is a side sectional view of an N-channel recessed gate power trench MOSFET 200 in accordance with various embodiments of the invention. In one embodiment, the N-channel recessed gate power trench MOSFET 200 can be fabricated by applying polysilicon CMP and dielectric material CMP planarization techniques in order to avoid surface topology issues. It is noted that by applying these techniques, a super-high density MOSFET gate channel width of the N-channel power trench MOSFET 200 can be achieved with advanced photolithographic printing. In an embodiment, a super-high density trench MOSFET can include at least 1 giga (or $1 \times 10^9$) cells within 20 square mm, but is not limited to such. Additionally, due to the recessed gate 214 of the N-channel power trench MOSFET 200, its source contact 216 can be self-aligned to the top source silicon surface 208. Moreover, due to the very high packing trench density of the N-channel power trench MOSFET 200, it provides a way to make both enhanced-mode MOSFET devices and depletion-mode MOSFET devices by controlling body doping inside the very thin silicon mesa located between trenches 210.

Specifically within an embodiment, the structure of the N-channel power trench MOSFET 200 has the recessed polysilicon gate 214 for its active area. It is noted that the recessed polysilicon gate 214 can be created by chemical mechanical polishing its polysilicon and then performing a polysilicon etch back. By utilizing the chemical mechanical polishing of the polysilicon gate 214 plus recessed polysilicon etch back, the upper polysilicon surface of the vertical polysilicon gate 214 is flatter and can be more precisely controlled. The recessed polysilicon gate 214 of the super-high density trench MOSFET 200 can be isolated from the source 216 by a buried dielectric material 220, such as but not limited to, silicon dioxide ($SiO_2$), LTO, SACVD oxide, and the like. Note that in one embodiment, the buried dielectric material isolation 220 can be created by utilizing a dielectric material chemical mechanical polishing process. Furthermore, the buried dielectric material isolation 220 enables the top silicon surface 208 to be the source, so the source contact 216 can be self-aligned to the top silicon surface 208 and the active trench gate 214 can be packed more densely than conventional trench MOSFETs.

Within FIG. 2, in one embodiment, the super high density N-channel power trench MOSFET 200 can include a very low resistivity (N++) substrate 202 having a N− epitaxial region or layer 204 formed thereon. Additionally, a P body region or layer 206 can be implanted into an upper portion of the N− epitaxial layer 204. Moreover, the super-high density power trench MOSFET 200 can include an N+ source region or layer 208 implanted into an upper portion of the P epitaxial layer 206. The power trench MOSFET 200 can also include trenches 210 located within the N+ source layer 208, the P body layer 206, and the N− epitaxial layer 204. In addition, the trenches 210 can include the polysilicon gates 214 encompassed by dielectric material 212 and dielectric material 220. The power trench MOSFET 200 can also include a source metal region or layer 216 deposited on or above the N+ source layer 208. Furthermore, the power trench MOSFET 200 can include a drain metal or back metal 218 deposited on or above the N++ substrate 202.

Note that the super high density N-channel power trench MOSFET 200 may not include all of the elements illustrated by FIG. 2. Moreover, the super high density power trench MOSFET 200 can be implemented to include one or more elements not illustrated by FIG. 2. It is noted that the super high density power trench MOSFET 200 can be utilized or implemented in any manner similar to that described herein, but is not limited to such.

Figure 3:
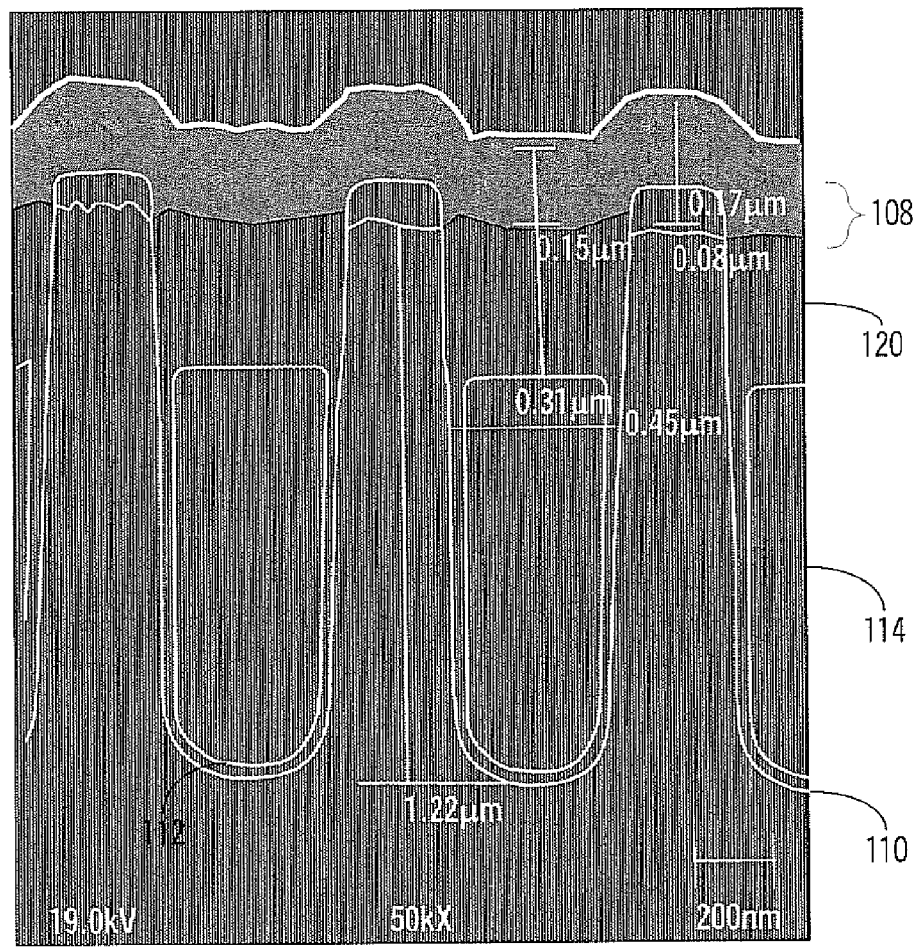
FIG. 3 illustrates a side sectional view of a portion of a fabricated super-high density P-channel recessed gate power trench MOSFET in accordance with an embodiment of the invention.

FIG. 3 illustrates a side sectional view of a portion of a fabricated super-high density P-channel recessed gate power trench MOSFET 300 in accordance with an embodiment of the invention. It is pointed out that the super-high density P-channel power trench MOSFET 300 can be fabricated and function in any manner similar to that described herein within reference to the super high density P-channel power trench MOSFET 100 of FIG. 1, but is not limited to such. Note that by utilizing advanced photolithography technology and techniques in accordance with various embodiments of the invention, the super-high density P-channel power trench MOSFET 300 of FIG. 3 can include, but is not limited to, a trench packing density that is greater than or equal to 1 giga-cells within 20 square mm, a cell pitch of less than or equal to 0.8 micrometers (μm), and a trench depth of approximately 1.22 μm. Furthermore, the dielectric material 120 located above the polysilicon gate 114 of the super-high density P-channel power trench MOSFET 300 can have a depth of approximately 0.31 μm while one of its trenches 110 can have a width of approximately 0.45 μm. In addition, the P+ source layer 108 of the super-high density P-channel power trench MOSFET 300 can have a depth of approximately 0.08 μm. In one embodiment, an angle source implant with approximately 45 degree tilt can have self-aligned source formed on the side wall of the silicon mesa above the polysilicon gate 114 of the super-high density P-channel power trench MOSFET 300.

It is pointed out that the super high density power trench MOSFET 300 may not include all of the elements illustrated by FIG. 3. In addition, the super high density power trench MOSFET 300 can be implemented to include one or more elements not illustrated by FIG. 3. It is noted that the super high density power trench MOSFET 300 can be utilized or implemented in any manner similar to that described herein, but is not limited to such.

Figure 4:
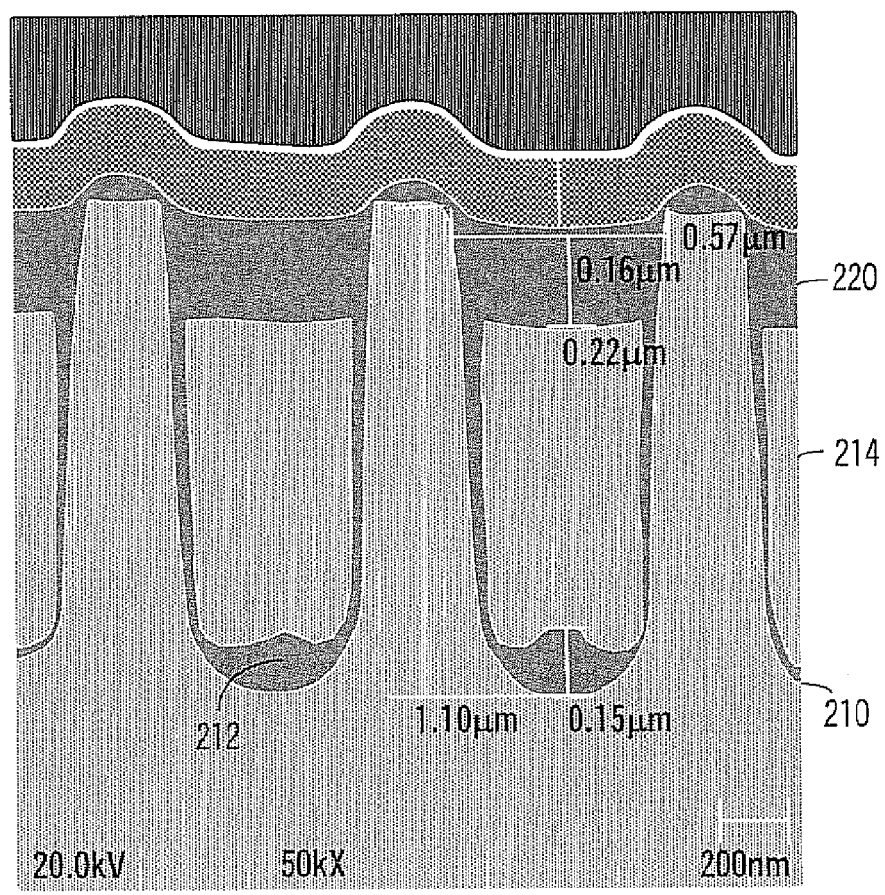
FIG. 4 illustrates a side sectional view of a portion of a fabricated super-high density N-channel recessed gate power trench MOSFET in accordance with an embodiment of the invention.

FIG. 4 illustrates a side sectional view of a portion of a fabricated super-high density thick bottom oxide (TBO) N-channel recessed gate power trench MOSFET 400 in accordance with an embodiment of the invention. It is noted that the super-high density N-channel power trench MOSFET 400 can be fabricated and function in any manner similar to that described herein within reference to the super high density N-channel power trench MOSFET 200 of FIG. 2, but is not limited to such. Note that by utilizing advanced photolithography technology and techniques in accordance with various embodiments of the invention, the super-high density N-channel power trench MOSFET 400 of FIG. 4 can include, but is not limited to, a trench packing density that is greater than or equal to 1 giga-cells within 20 square mm, a cell pitch of less than or equal to 0.8 μm, and a trench depth of approximately 1.10 μm. Additionally, the dielectric material 220 located above the polysilicon gate 214 of the super-high density N-channel power trench MOSFET 400 can have a depth of approximately 0.22 μm while one of its trenches 210 can have a width of approximately 0.57 μm near the top of that trench. Furthermore, the thick bottom oxide (or dielectric material) 212 can have a depth of approximately 0.15 μm.

Note that the super high density power trench MOSFET 400 may not include all of the elements illustrated by FIG. 4. Furthermore, the super high density power trench MOSFET 400 can be implemented to include one or more elements not illustrated by FIG. 4. It is pointed out that the super high density power trench MOSFET 400 can be utilized or implemented in any manner similar to that described herein, but is not limited to such.

Figure 5:
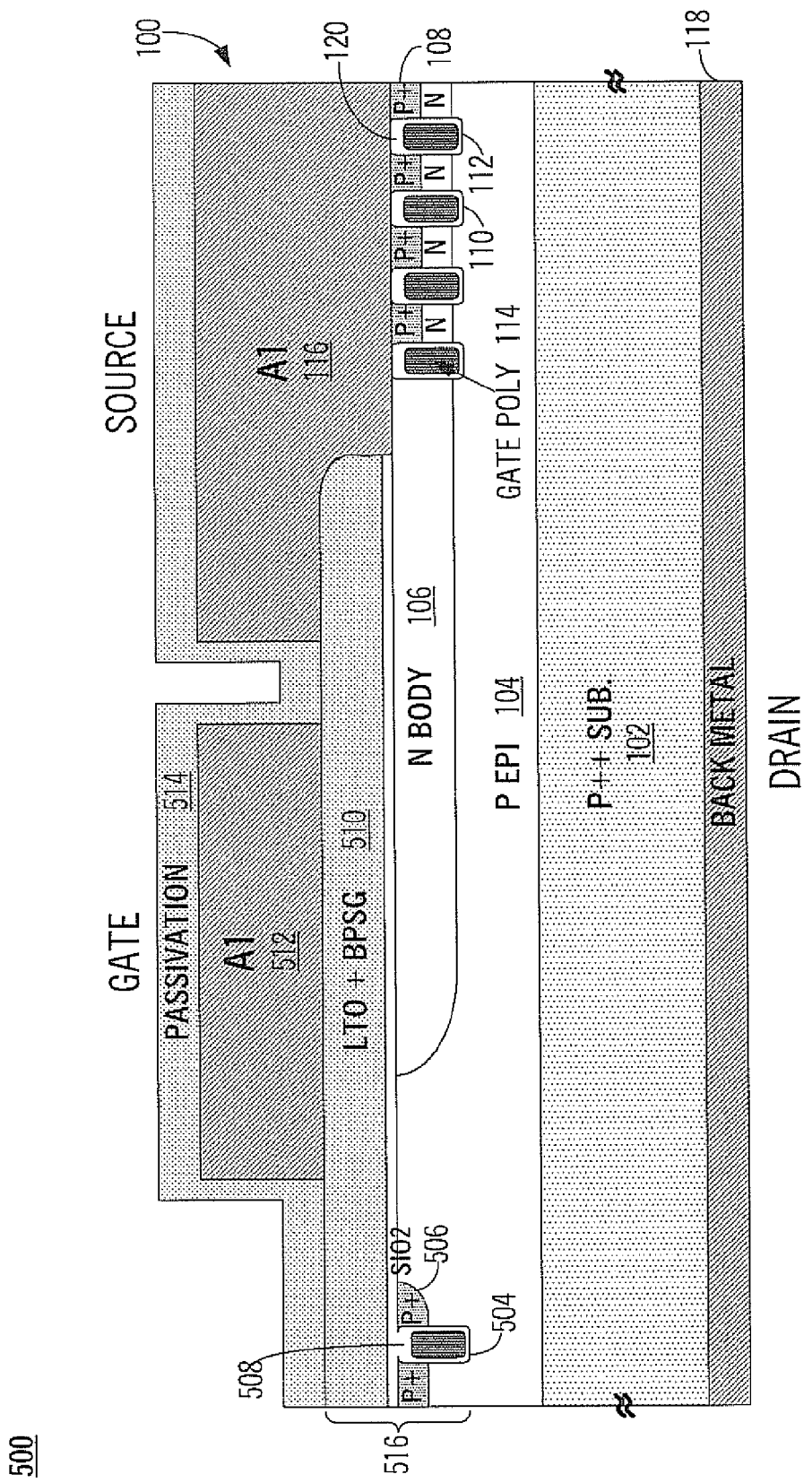
FIG. 5 is a side sectional view of a plurality of trenches plus a conventional edge termination in accordance with various embodiments of the invention.

FIG. 5 is a side sectional view of a device 500 in accordance with various embodiments of the invention. Specifically, the device 500 includes a conventional edge termination 516 together with the super-high density P-channel recessed gate power trench MOSFET 100. In one embodiment, the device 500 can be fabricated by utilizing polysilicon CMP, polysilicon etch back, and dielectric material CMP planarization techniques in order to avoid surface topology issues. Note that a portion of the edge termination 516 can be fabricated within the P− epitaxial layer 104. For example, the edge termination 516 can include a trench 504 located within the P− epitaxial layer 104. In addition, the trench 504 can include a die edge polysilicon 502 encompassed by dielectric material 508, such as but not limited to, silicon dioxide ($SiO_2$), LTO, SACVD oxide, and the like. Furthermore, the edge termination 516 can include P+ regions 506 that can be implanted into the P− epitaxial layer 104 on both sides of the trench 504. Note that the dielectric material 508 can extend beneath the source contact 116. Moreover, the edge termination 516 can include a low temperature oxide (LTO) and borophosphosilicate glass (BPSG) layer 510 deposited above the dielectric material 508 in order to reduce the electrical field in this area. It is noted that the LTO and BPSG (LTO+BPSG) layer 510 and the dielectric material 508 can extend beneath the source metal 116. A gate metal bus 512 of the device 500 can be formed above the LTO+BPSG layer 510. Additionally, a passivation layer 514 can be deposited above the LTO+BPSG layer 510, the gate metal bus 512, and the source metal 116.

It is pointed out that in one embodiment the device 500 can be fabricated to include the super-high density N-channel recessed gate power trench MOSFET 200 together with an edge termination similar to the edge termination 516. For example in this embodiment, any P region or substrate shown within the device 500 can be implemented with a corresponding N region or substrate. Moreover, any N region shown within the device 500 can be implemented with a corresponding P region.

It is noted that the device 500 may not include all of the elements illustrated by FIG. 5. In addition, the device 500 can be implemented to include one or more elements not illustrated by FIG. 5. It is pointed out that the device 500 can be utilized or implemented in any manner similar to that described herein, but is not limited to such.

Figure 6:
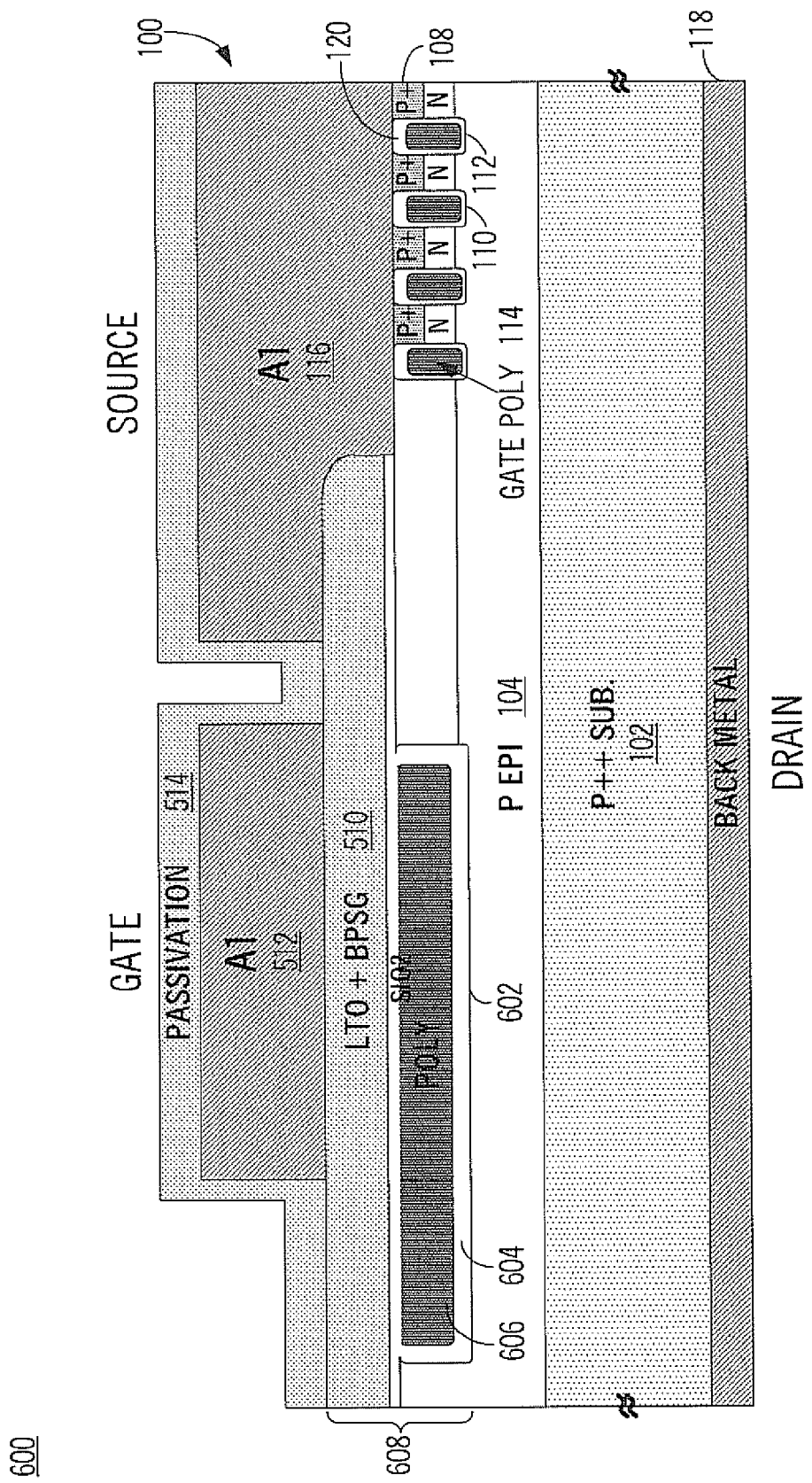
FIG. 6 is a side sectional view of a plurality of trenches plus a trench edge termination in accordance with various embodiments of the invention.

FIG. 6 is a side sectional view of a device 600 in accordance with various embodiments of the invention. Specifically, the device 600 includes a trench edge termination 608 together with the super-high density P-channel recessed gate power trench MOSFET 100. In one embodiment, the device 600 can be fabricated by utilizing polysilicon CMP, polysilicon etch back, and dielectric material CMP planarization techniques in order to avoid surface topology issues. Note that a portion of the trench edge termination 608 can be fabricated within the P− epitaxial layer 104. For example, the trench edge termination 608 can include an edge termination trench 602 located within the P− epitaxial layer 104. In addition, the trench 602 can include an edge termination polysilicon 606 encompassed by dielectric material 604, such as but not limited to, silicon dioxide (SiO$_2$), LTO, SACVD oxide, and the like. Note that the dielectric material 604 can be fabricated having different thicknesses inside the edge termination trench 602. For example in an embodiment, the thickness of the dielectric material 604 inside the edge termination trench 602 can be defined by the breakdown voltage (BVds) rating of the device 600. It is pointed out that the dielectric material 604 can extend beneath the source metal 116. Furthermore, the trench edge termination 608 can include a low temperature oxide (LTO) and borophosphosilicate glass (BPSG) layer 510 deposited above the dielectric material 604 in order to reduce the electrical field in this area. Note that the LTO+ BPSG layer 510 and the dielectric material 604 can extend beneath the source metal 116. A gate metal bus 512 of the device 600 can be formed above the LTO+BPSG layer 510. In addition, a passivation layer 514 can be deposited above the LTO+BPSG layer 510, the gate metal bus 512, and the source metal 116.

In one embodiment, the trench edge termination 608 can be fabricated separately from or together with the super-high density P-channel recessed gate power trench MOSFET 100. In an embodiment, the dielectric material 604 can be deposited and/or grown within the edge termination trench 602. For example, if it is desirable for the dielectric material 604 to be thick within the edge termination trench 602, the dielectric material 604 can be deposited within the edge termination trench 602 by utilizing a mask. Once the dielectric material 604 has been deposited and/or grown within the edge termination trench 602, the edge termination polysilicon 606 can be deposited above the dielectric material 604. After which, a polysilicon CMP process can be utilized to planarize the edge termination polysilicon 606. As such, the polysilicon CMP process can return a substantially flat silicon surface which enables the edge termination process to be inserted within any process flow without creating topography induced process problems. In addition, a polysilicon etch back process can be utilized on the edge termination polysilicon 606. Furthermore, a deposition of dielectric material 604 can be performed over the edge termination polysilicon 606 and the N body layer 106. In one embodiment, a dielectric material CMP process can be performed on the newly deposited dielectric material 604. It is pointed out that the trench edge termination 608 can be formed without creating any new topology on its surface and consuming a lot of silicon area.

Within FIG. 6, it is noted that in various embodiments, the edge termination trench 602 can be utilized for other purposes besides fabricating the trench edge termination 608. For example, a wide variety of functional polysilicon structures, such as, a polysilicon diode, a polysilicon resistor, a polysilicon temperature sensor, or the like, can be fabricated within the edge termination trench 602. It is pointed out that one or more functional polysilicon structures can be fabricated within the edge termination trench 602 in a wide variety of ways. For instance, the one or more functional polysilicon structures can be fabricated within the edge termination trench 602 in any manner described within U.S. Pat. No. 7,544,545 entitled "Trench Polysilicon Diode", by Chen et al., issued Jun. 9, 2009, which is hereby incorporated by reference. In one embodiment, the super-high density P-channel recessed gate power trench MOSFET 100 of FIG. 6 and the one or more functional polysilicon structures within the edge termination trench 602 can be fabricated together or at substantially the same time, which can reduce manufacturing costs. In an embodiment, the super-high density P-channel recessed gate power trench MOSFET 100 of FIG. 6 can be fabricated separately from the one or more functional polysilicon structures within the edge termination trench 602.

It is noted that in one embodiment the device 600 can be fabricated to include the super-high density N-channel recessed gate power trench MOSFET 200 together with a trench edge termination similar to the trench edge termination 608. For example in this embodiment, any P region or substrate shown within the device 600 can be implemented with a corresponding N region or substrate. Moreover, any N region shown within the device 600 can be implemented with a corresponding P region.

It is pointed out that the device 600 may not include all of the elements illustrated by FIG. 6. Additionally, the device 600 can be implemented to include one or more elements not illustrated by FIG. 6. It is noted that the device 600 can be utilized or implemented in any manner similar to that described herein, but is not limited to such.

Figure 7:
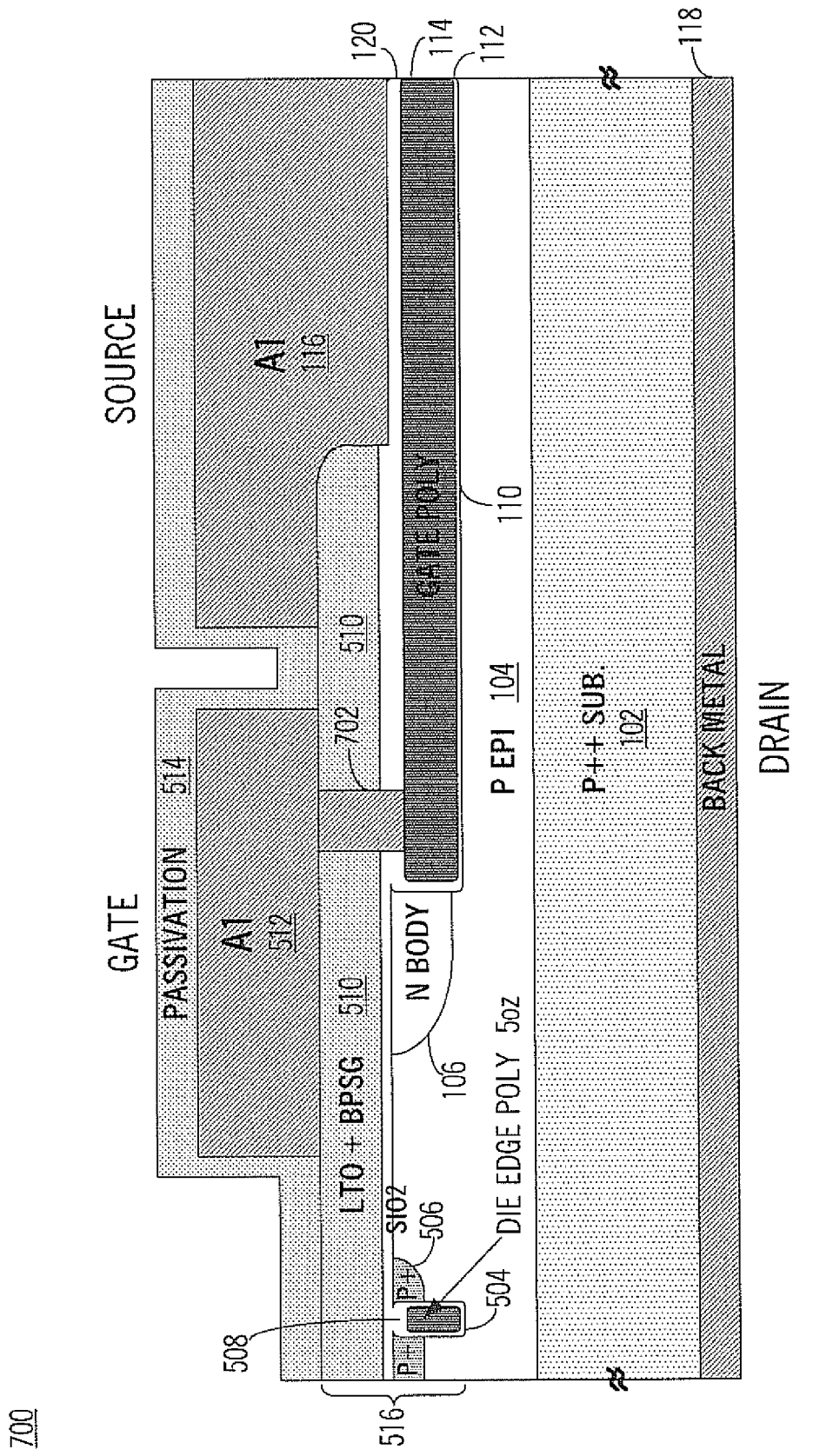
FIG. 7 is a side sectional view of yet another gate pickup plus a conventional edge termination along an active trench center in accordance with various embodiments of the invention.

FIG. 7 is a side sectional view of a device 700 in accordance with various embodiments of the invention. Specifically, the device 700 includes the conventional edge termination 516 together with a gate pickup associated with the super-high density P-channel recessed gate power trench MOSFET 100 (not shown). In one embodiment, the device 700 can be fabricated by utilizing polysilicon CMP, polysilicon etch back, and dielectric material CMP planarization techniques in order to avoid surface topology issues. In an embodiment, the device 700 illustrates how the gate polysilicon 114 can be coupled to the gate metal bus 512. For example, one or more polysilicon gates 114 can be fabricated to extend beneath the source metal 116 and the gate metal bus 512. A hole or via 702 can be formed through the low temperature oxide (LTO) and borophosphosilicate glass (BPSG) layer 510 and the combination of dielectric materials 508 and 120. In an embodiment, when metal is utilized to form the gate metal bus 512, the metal of the gate metal bus 512 can fill the via 702 and thereby contact the gate polysilicon 114.

It is noted that a portion of the edge termination 516 can be fabricated within the P− epitaxial layer 104. For example, the edge termination 516 can include a trench 504 located within the P− epitaxial layer 104. In addition, the trench 504 can include a die edge polysilicon 502 encompassed by dielectric material 508, such as but not limited to, silicon dioxide (SiO$_2$), LTO, SACVD oxide, and the like. Additionally, the edge termination 516 can include P+ regions 506 that can be implanted into the P− epitaxial layer 104 on both sides of the trench 504. It is pointed out that the dielectric material 508 can extend beneath the source metal 116. Moreover, the edge termination 516 can include the LTO+ BPSG layer 510 deposited above the dielectric material 508 in order to reduce the electrical field in this area. It is noted that the LTO+BPSG layer 510 and the dielectric material 508 can extend beneath the source metal 116. A gate contact 512 of the device 700 can be formed above the LTO+BPSG layer 510. A passivation layer 514 can be deposited above the LTO+BPSG layer 510, the gate metal bus 512, and the source metal 116.

Within FIG. 7, in one embodiment the device 700 can be fabricated differently than shown. For example in this embodiment, any P region or substrate shown within the device 700 can be implemented with a corresponding N region or substrate. Moreover, any N region shown within the device 700 can be implemented with a corresponding P region.

Note that the device 700 may not include all of the elements illustrated by FIG. 7. Moreover, the device 700 can be implemented to include one or more elements not illustrated by FIG. 7. It is noted that the device 700 can be utilized or implemented in any manner similar to that described herein, but is not limited to such.

Figure 8:
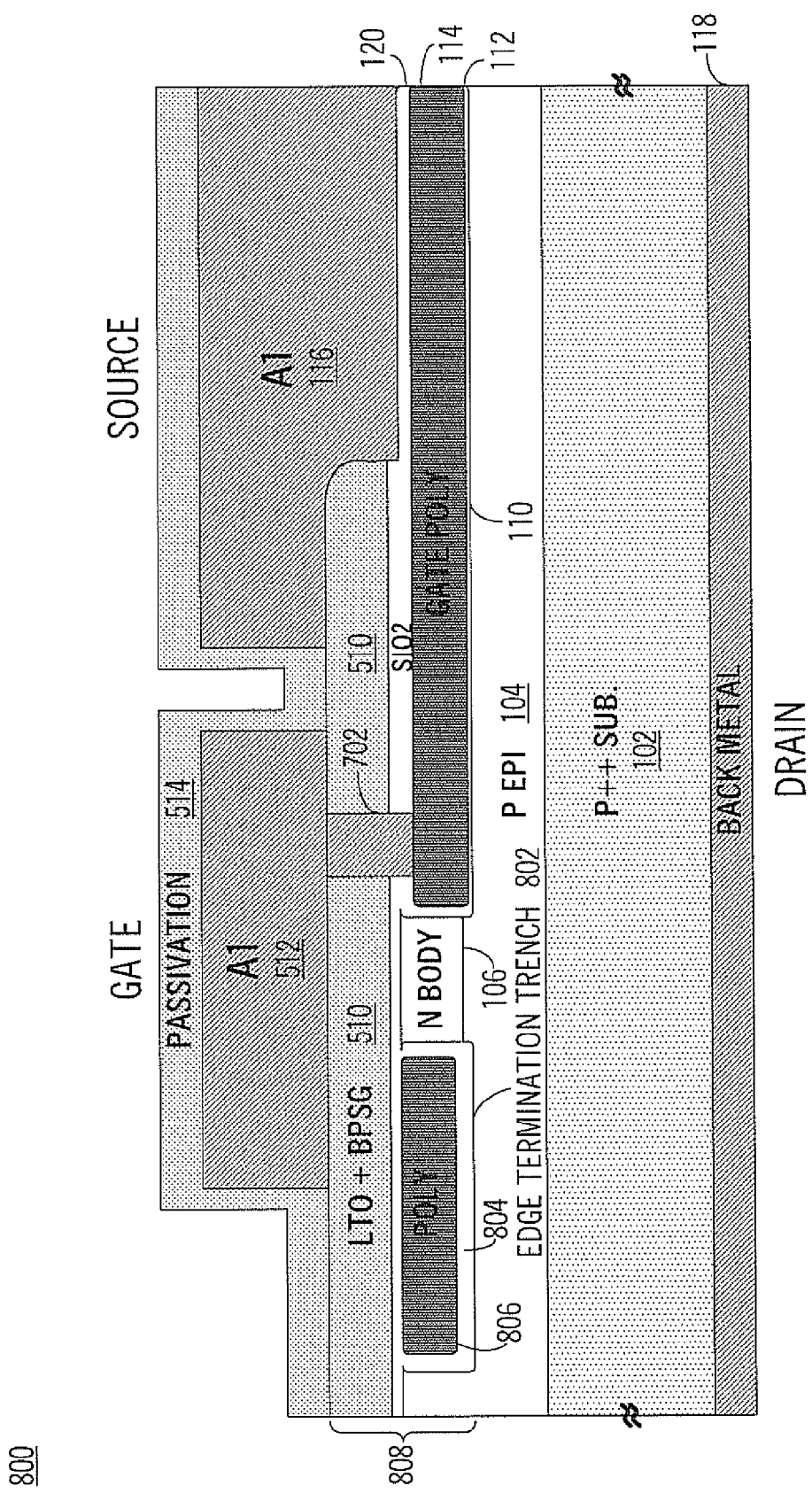
FIG. 8 is a side sectional view of still another gate pickup plus a trench edge termination along an active trench center in accordance with various embodiments of the invention.

FIG. 8 is a side sectional view of a device 800 in accordance with various embodiments of the invention. Specifically, the device 800 includes a trench edge termination 808 together with a gate pickup associated with the super-high density P-channel recessed gate power trench MOSFET 100 (not shown). It is pointed out that the trench edge termination 808 can be fabricated and function in any manner similar to that described herein within reference to the trench edge termination 608 of FIG. 6, but is not limited to such. In one embodiment, the device 800 can be fabricated by utilizing polysilicon CMP, polysilicon etch back, and dielectric material CMP planarization techniques in order to avoid surface topology issues. Note that the trench edge termination 808 can be implemented and function in any manner similar to any trench edge termination described herein, but is not limited to such. In an embodiment, the device 800 illustrates how the gate polysilicon 114 can be coupled to the gate metal bus 512. For example, one or more polysilicon gates 114 can be fabricated to extend beneath the source metal 116 and the gate metal bus 512. A hole or via 702 can be formed through the low temperature oxide (LTO) and borophosphosilicate glass (BPSG) layer 510 and the combination of dielectric materials 804 and 120. In one embodiment, when metal is utilized to form the gate metal bus 512, the metal of the gate metal bus 512 can fill the via 702 and thereby contact the gate polysilicon 114.

It is pointed out that a portion of the trench edge termination 808 can be fabricated within the P− epitaxial layer 104. For example, the trench edge termination 808 can include a trench 802 formed within the P− epitaxial layer 104. Moreover, the trench 802 can include an edge termination polysilicon 806 encompassed by dielectric material 804, such as but not limited to, silicon dioxide ($SiO_2$), LTO, SACVD oxide, and the like. Note that the dielectric material 804 can be fabricated having one or more different thicknesses inside the edge termination trench 802. For example in an embodiment, the thickness of the dielectric material 804 inside the edge termination trench 802 can be defined by the breakdown voltage (BVds) rating of the device 800. Note that the dielectric material 804 can extend beneath the source metal 116. Furthermore, the trench edge termination 808 can include the LTO+BPSG layer 510 deposited above the dielectric material 804 in order to reduce the electrical field in this area. Note that the LTO+BPSG layer 510 and the dielectric material 804 can extend beneath the source metal 116. The gate metal 512 of the device 800 can be formed above the LTO+BPSG layer 510. In addition, a passivation layer 514 can be deposited above the LTO+BPSG layer 510, the gate metal bus 512, and the source metal 116.

Within FIG. 8, in one embodiment the device 800 can be fabricated differently than shown. For example in this embodiment, any P region or substrate shown within the device 800 can be implemented with a corresponding N region or substrate. In addition, any N region shown within the device 800 can be implemented with a corresponding P region.

It is pointed out that the device 800 may not include all of the elements illustrated by FIG. 8. Furthermore, the device 800 can be implemented to include one or more elements not illustrated by FIG. 8. Note that the device 800 can be utilized or implemented in any manner similar to that described herein, but is not limited to such.

Figure 9:
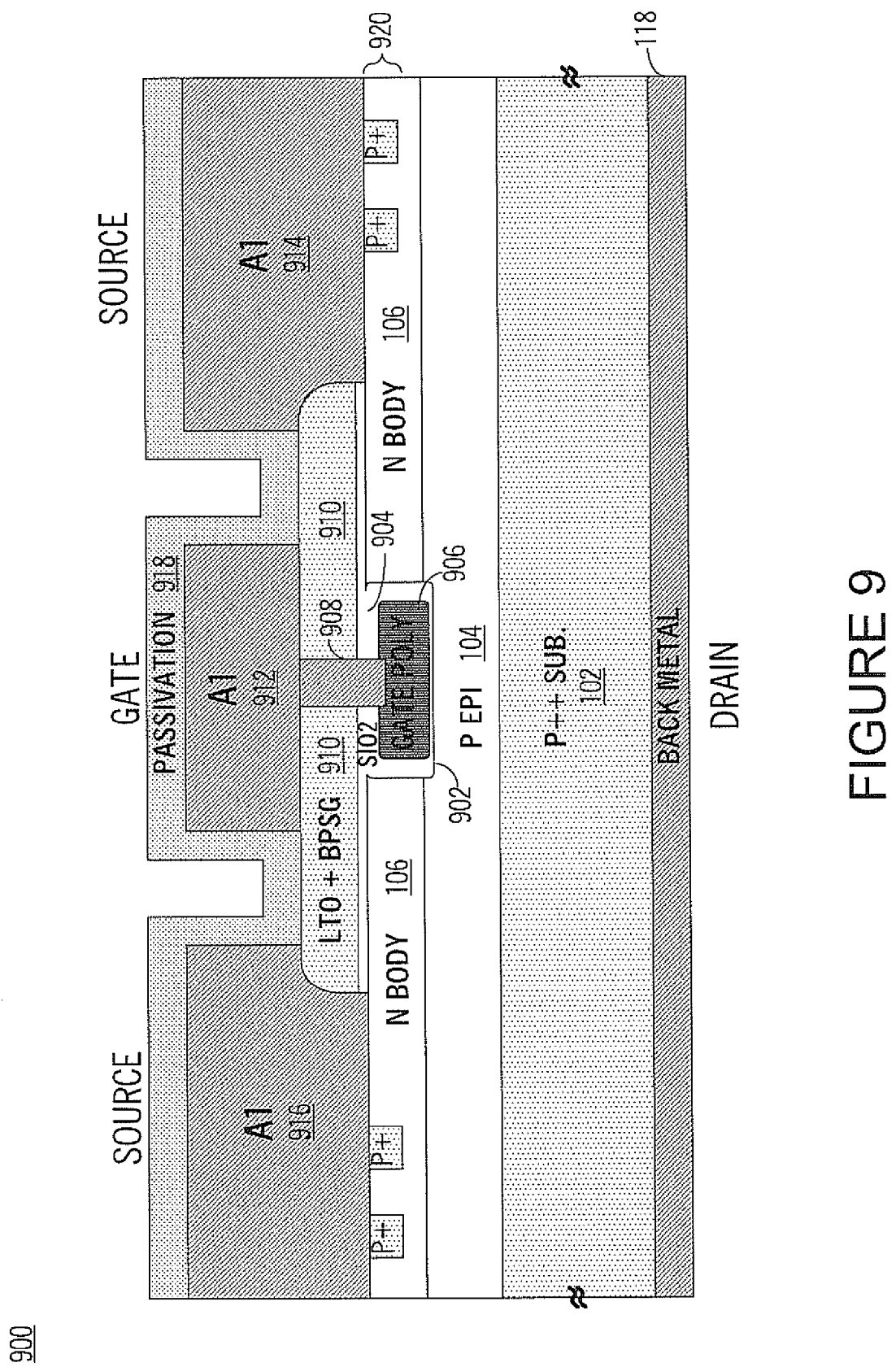
FIG. 9 is a side sectional view of an additional gate pickup finger region to reduce gate resistance along a mesa center in accordance with various embodiments of the invention.

FIG. 9 is a side sectional view of a device 900 in accordance with various embodiments of the invention. Specifically, the device 900 includes a gate finger associated with the super-high density P-channel recessed gate power trench MOSFET 100 (not shown). Note that when a die becomes large, it may be desirable to include one or more polysilicon gate fingers 906 within it to prevent gate charge delay issues within the die. In an embodiment, the device 900 can be fabricated by utilizing polysilicon CMP, polysilicon etch back, and dielectric material CMP planarization techniques in order to avoid surface topology issues. In one embodiment, the device 900 illustrates how a polysilicon gate finger 906 can be coupled to a gate metal 912. For example, a gate finger trench 902 can be fabricated within the N body 106 and the P− epitaxial layer 104. Additionally, the gate finger trench 902 can include the polysilicon gate finger 906 encompassed by dielectric material 904, such as but not limited to, silicon dioxide ($SiO_2$), LTO, SACVD oxide, and the like. Note that the dielectric material 904 can extend beneath the gate metal 912 and source metal 914 and 916.

Furthermore, a LTO+BPSG layer 910 can be deposited above the dielectric material 904 in order to reduce the electrical field in this area. Note that the LTO+BPSG layer 910 and the dielectric material 904 can extend beneath the gate metal 912 and source metals 914 and 916. The gate metal 912 of the device 900 can be formed above the LTO+BPSG layer 910. In addition, a passivation layer 918 can be deposited above the LTO+BPSG layer 910, the gate metal 912, and the source metals 914 and 916. A hole or via 908 can be formed through the LTO+BPSG layer 910 and the dielectric material 904. In one embodiment, when metal is utilized to form the gate metal 912, the metal of the gate metal 912 can fill the via 908 and thereby contact the polysilicon gate finger 906. Note that P+ source regions 920 have been implanted into the N body layer 106 beneath the source metals 914 and 916.

Within FIG. 9, in one embodiment the device 900 can be fabricated differently than shown. For example in this embodiment, any P region or substrate shown within the device 900 can be implemented with a corresponding N region or substrate. In addition, any N region shown within the device 900 can be implemented with a corresponding P region.

Note that the device 900 may not include all of the elements illustrated by FIG. 9. Furthermore, the device 900 can be implemented to include one or more elements not illustrated by FIG. 9. It is noted that the device 900 can be utilized or implemented in any manner similar to that described herein, but is not limited to such.

Figure 10:
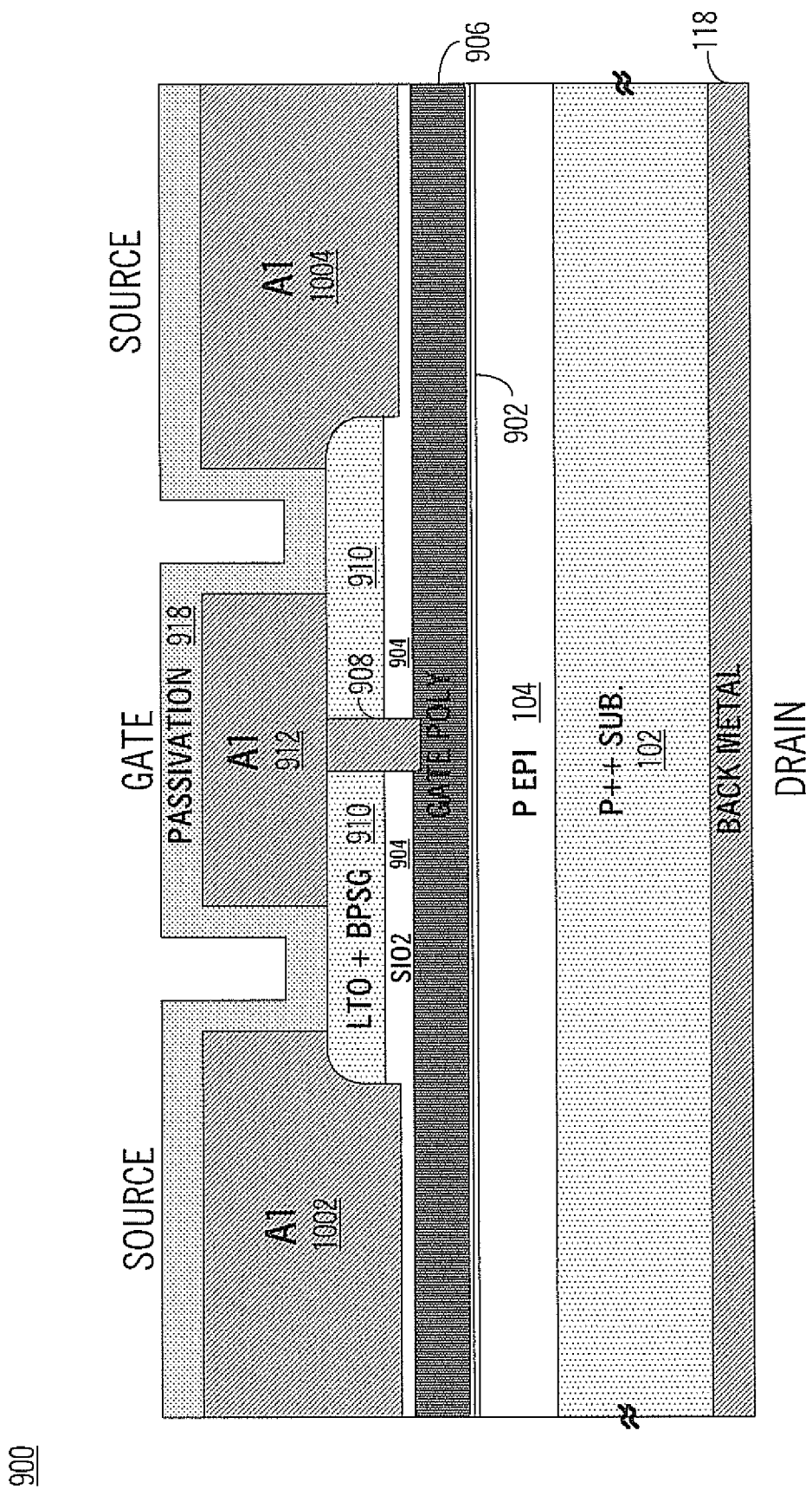
FIG. 10 is a different side sectional view of the gate pickup finger region of FIG. 9 along the trench center in accordance with various embodiments of the invention.

FIG. 10 is a different side sectional view of the device 900 of FIG. 9 in accordance with various embodiments of the invention. Specifically, FIG. 10 is a lengthwise side sectional view of the polysilicon gate finger 906 of the device 900. In one embodiment, the device 900 of FIG. 10 can be fabricated by utilizing polysilicon CMP, polysilicon etch back, and dielectric material CMP planarization techniques in order to avoid surface topology issues. In an embodiment, the device 900 illustrates how the polysilicon gate finger 906 can be coupled to the gate metal 912.

For example, the gate finger trench 902 can be fabricated within the N body 106 (not shown) and the P− epitaxial layer 104. The gate finger trench 902 can include the polysilicon gate finger 906 encompassed by dielectric material 904, such as but not limited to, silicon dioxide (SiO$_2$), LTO, SACVD oxide, and the like. Note that the dielectric material 904 can extend beneath the gate metal 912 and source metals 1002 and 1004. Moreover, the LTO+BPSG layer 910 can be deposited above the dielectric material 904 in order to reduce the electrical field in this area. Note that the LTO+BPSG layer 910 can extend beneath the gate metal 912 and a portion of each of the source metals 1002 and 1004. The gate metal 912 of the device 900 can be formed above the LTO+BPSG layer 910. Furthermore, the passivation layer 918 can be deposited above the LTO+BPSG layer 910, the gate metal 912, and the source metals 1002 and 1004. The hole or via 908 can be formed through the LTO+BPSG layer 910 and the dielectric material 904. In one embodiment, when metal is utilized to form the gate metal 912, the metal of the gate metal 912 can fill the via 908 and thereby contact the polysilicon gate finger 906.

Within FIG. 10, in one embodiment the device 900 can be fabricated differently than shown. For example in this embodiment, any P region or substrate shown within the device 900 can be implemented with a corresponding N region or substrate. In addition, any N region shown within the device 900 can be implemented with a corresponding P region.

It is noted that the device 900 may not include all of the elements illustrated by FIG. 10. In addition, the device 900 can be implemented to include one or more elements not illustrated by FIG. 10. Note that the device 900 can be utilized or implemented in any manner similar to that described herein, but is not limited to such.

Note that each of FIGS. 11-14 is a flow diagram of a method in accordance with various embodiments of the invention. Although specific operations are disclosed in each flow diagram, such operations are examples. Each of the methods may not include all of the operations illustrated by their respective figure. Also, each method may include various other operations and/or variations of the operations shown. Likewise, the sequence of the operations of each flow diagram can be modified. It is appreciated that not all of the operations in each flow diagram may be performed. In various embodiments, one or more of the operations of each method can be controlled or managed by software, by firmware, by hardware or by any combination thereof, but is not limited to such. Each method can include processes of embodiments of the invention which can be controlled or managed by a processor(s) and electrical components under the control of computer or computing device readable and executable instructions (or code). The computer or computing device readable and executable instructions (or code) may reside, for example, in data storage features such as computer or computing device usable volatile memory, computer or computing device usable non-volatile memory, and/or computer or computing device usable mass data storage. However, the computer or computing device readable and executable instructions (or code) may reside in any type of computer or computing device readable medium or memory.

Figure 11:
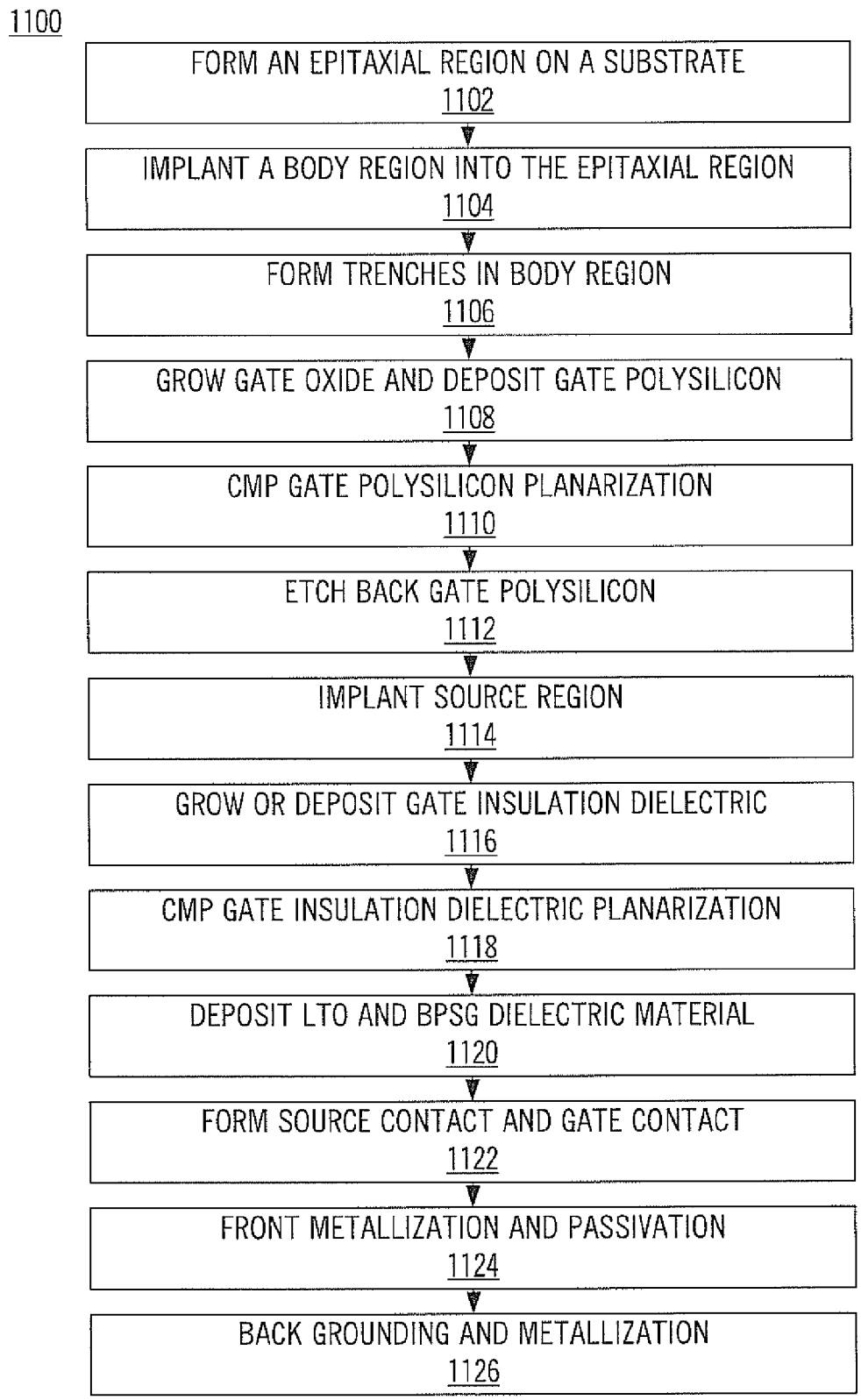
FIG. 11 is a flow diagram of a method that includes conventional edge termination in accordance with various embodiments of the invention.

FIG. 11 is a flow diagram of a method 1100 in accordance with various embodiments of the invention for fabricating a super-high density trench MOSFET. For example, method 1100 can include forming an epitaxial region on a substrate. In addition, a body region can be implanted into the epitaxial region. Trenches can be formed in the body region and the epitaxial region as part of a vertical MOSFET. Furthermore, gate oxide can be grown and gate polysilicon can be deposited within the trenches. Chemical mechanical polishing (CMP) can be performed on the gate polysilicon and etching back the gate polysilicon. One or more source regions can be implanted into the body region. Dielectric material can be grown or deposited over the gate polysilicon and within the one or more trenches. CMP the dielectric material. LTO and BPSG dielectric can be deposited on its top surface. Etch source and gate contacts. Front metal layer and passivation layer can be formed. Wafer back grounding and metallization can be formed. In this manner, a super-high density trench MOSFET can be fabricated in accordance with various embodiments of the invention.

At operation 1102 of FIG. 11, an epitaxial region (e.g., 104 or 204) can be formed on a substrate (e.g., 102 or 202). It is pointed out that operation 1102 can be implemented in a wide variety of ways. For example, operation 1102 can be implemented in any manner similar to that described herein, but is not limited to such.

At operation 1104, a body region (e.g., 106 or 206) can be implanted into the epitaxial region. It is noted that operation 1104 can be implemented in a wide variety of ways. For example, operation 1104 can be implemented in any manner similar to that described herein, but is not limited to such.

At operation 1106 of FIG. 11, trenches (e.g., 110 or 210) can be formed or etched into the body region and the epitaxial region as part of a vertical MOSFET (e.g., 100 or 200). Note that operation 1106 can be implemented in a wide variety of ways. For example, operation 1106 can be implemented in any manner similar to that described herein, but is not limited to such.

At operation 1108 of FIG. 11, gate oxide (e.g., 112 or 212) can be grown and gate polysilicon (e.g., 114 or 214) can be deposited within the trenches. It is noted that operation 1108 can be implemented in a wide variety of ways. For example, operation 1108 can be implemented in any manner similar to that described herein, but is not limited to such.

At operation 1110 of FIG. 11, CMP the gate polysilicon in order to substantially planarize it. Note that operation 1110 can be implemented in a wide variety of ways. For example, operation 1110 can be implemented in any manner similar to that described herein, but is not limited to such.

At operation 1112, etch back the gate polysilicon. It is noted that operation 1112 can be implemented in a wide variety of ways. For example, operation 1112 can be implemented in any manner similar to that described herein, but is not limited to such.

At operation 1114, one or more source regions (e.g., 108 or 208) can be implanted into the body region. It is pointed out that operation 1114 can be implemented in a wide variety of ways. For example, operation 1114 can be implemented in any manner similar to that described herein, but is not limited to such.

At operation 1116 of FIG. 11, dielectric material (e.g., 120 or 220) can be grown or deposited over the gate polysilicon and within the one or more trenches. It is pointed out that operation 1116 can be implemented in a wide variety of ways. For example, operation 1116 can be implemented in any manner similar to that described herein, but is not limited to such.

At operation 1118, CMP the gate insulation dielectric material in order to substantially planarize it. Note that operation 1118 can be implemented in a wide variety of ways. For example, operation 1118 can be implemented in any manner similar to that described herein, but is not limited to such.

At operation 1120 of FIG. 11, LTO and BPSG dielectric can be deposited on its top surface. Note that operation 1120 can be implemented in a wide variety of ways. For example, operation 1120 can be implemented in any manner similar to that described herein, but is not limited to such.

At operation 1122, etch (or form) source and gate contacts. It is noted that operation 1122 can be implemented in a wide variety of ways. For example, operation 1122 can be implemented in any manner similar to that described herein, but is not limited to such.

At operation 1124 of FIG. 11, front metal layer (e.g., 116, 216, 512, or 912) and passivation layer (e.g., 514 or 918) can be formed. It is pointed out that operation 1124 can be implemented in a wide variety of ways. For example, operation 1124 can be implemented in any manner similar to that described herein, but is not limited to such.

At operation 1126 of FIG. 11, wafer back grounding and metallization (e.g., 118) can be formed. Note that operation 1126 can be implemented in a wide variety of ways. For example, operation 1126 can be implemented in any manner similar to that described herein, but is not limited to such. Once operation 1126 is completed, process 1100 can be ended or exited. In this manner, a super-high density trench MOSFET can be fabricated in accordance with various embodiments of the invention.

Figure 12:
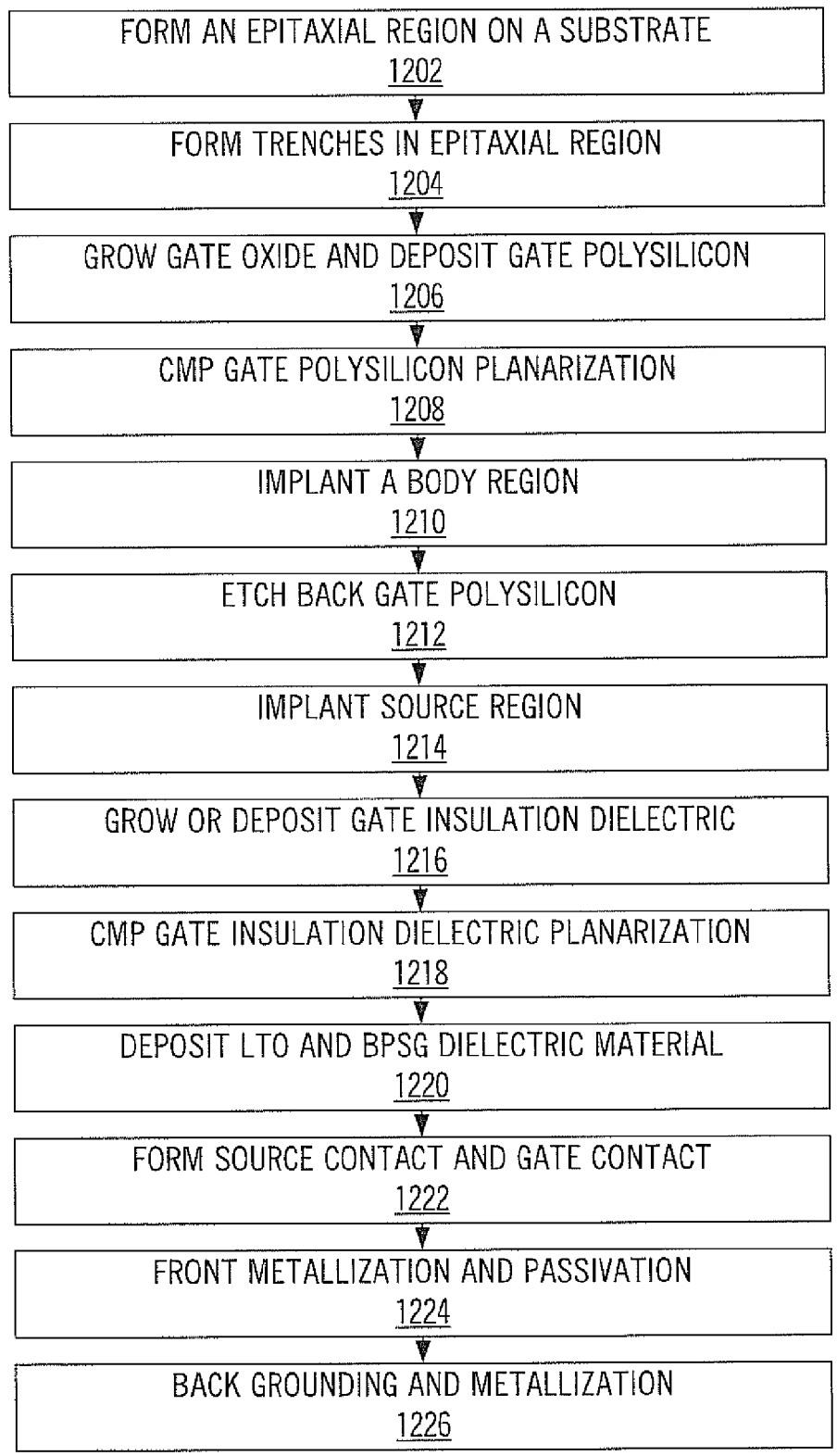
FIG. 12 is a flow diagram of another method that includes conventional edge termination in accordance with various embodiments of the invention.

FIG. 12 is a flow diagram of a method 1200 in accordance with various embodiments of the invention for fabricating a super-high density trench MOSFET. For example, method 1200 can include forming an epitaxial region on a substrate. Additionally, trenches can be formed or etched into the epitaxial region as part of a vertical MOSFET. Gate oxide can be grown and gate polysilicon can be deposited within the trenches. Moreover, chemical mechanical polishing can be performed on the gate polysilicon. A body region can be implanted into the epitaxial region. In addition, the method 1200 can include etching back the gate polysilicon. One or more source regions can be implanted into the body region. Dielectric material can be grown or deposited over the gate polysilicon and within the one or more trenches. Furthermore, chemical mechanical polishing can be performed on the dielectric material. LTO and BPSG dielectric can be deposited on its top surface. Furthermore, the method 1200 can include etching source and gate contacts. Front metal layer and passivation layer can be formed. Wafer back grounding and metallization can be formed. In this manner, a super-high density trench MOSFET can be fabricated in accordance with various embodiments of the invention.

At operation 1202 of FIG. 12, an epitaxial region (e.g., 104 or 204) can be formed on a substrate (e.g., 102 or 202). It is pointed out that operation 1202 can be implemented in a wide variety of ways. For example, operation 1202 can be implemented in any manner similar to that described herein, but is not limited to such.

At operation 1204, trenches (e.g., 110 or 210) can be formed or etched into the epitaxial region as part of a vertical MOSFET (e.g., 100 or 200). It is noted that operation 1204 can be implemented in a wide variety of ways. For example, operation 1204 can be implemented in any manner similar to that described herein, but is not limited to such.

At operation 1206 of FIG. 12, gate oxide (e.g., 112 or 212) can be grown and gate polysilicon (e.g., 114 or 214) can be deposited within the trenches. Note that operation 1206 can be implemented in a wide variety of ways. For example, operation 1206 can be implemented in any manner similar to that described herein, but is not limited to such.

At operation 1208 of FIG. 12, CMP the gate polysilicon in order to substantially planarize it. It is pointed out that operation 1208 can be implemented in a wide variety of ways. For example, operation 1208 can be implemented in any manner similar to that described herein, but is not limited to such.

At operation 1210, a body region (e.g., 106 or 206) can be implanted into the epitaxial region. It is noted that operation 1210 can be implemented in a wide variety of ways. For example, operation 1210 can be implemented in any manner similar to that described herein, but is not limited to such.

At operation 1212, etch back the gate polysilicon. It is noted that operation 1212 can be implemented in a wide variety of ways. For example, operation 1212 can be implemented in any manner similar to that described herein, but is not limited to such.

At operation 1214, one or more source regions (e.g., 108 or 208) can be implanted into the body region. It is pointed out that operation 1214 can be implemented in a wide variety of ways. For example, operation 1214 can be implemented in any manner similar to that described herein, but is not limited to such.

At operation 1216 of FIG. 12, dielectric material (e.g., 120 or 220) can be grown or deposited over the gate polysilicon and within the one or more trenches. It is pointed out that operation 1216 can be implemented in a wide variety of ways. For example, operation 1216 can be implemented in any manner similar to that described herein, but is not limited to such.

At operation 1218, CMP the gate insulation dielectric material in order to substantially planarize it. Note operation 1218 can be implemented in a wide variety of ways. For example, operation 1218 can be implemented in any manner similar to that described herein, but is not limited to such.

At operation 1220 of FIG. 12, LTO and BPSG dielectric can be deposited on its top surface. Note that operation 1220 can be implemented in a wide variety of ways. For example, operation 1220 can be implemented in any manner similar to that described herein, but is not limited to such.

At operation 1222, etch (or form) source and gate contacts. It is noted that operation 1222 can be implemented in a wide variety of ways. For example, operation 1222 can be implemented in any manner similar to that described herein, but is not limited to such.

At operation 1224 of FIG. 12, front metal layer (e.g., 116 or 216 or 512 or 912) and passivation layer (e.g., 514 or 918) can be formed. It is pointed out that operation 1224 can be implemented in a wide variety of ways. For example, operation 1224 can be implemented in any manner similar to that described herein, but is not limited to such.

At operation 1226, wafer back grounding and metallization (e.g., 118) can be formed. Note that operation 1226 can be implemented in a wide variety of ways. For example, operation 1226 can be implemented in any manner similar to that described herein, but is not limited to such. Once operation 1226 is completed, process 1200 can be ended or exited. In this fashion, a super-high density trench MOSFET can be fabricated in accordance with various embodiments of the invention.

Figure 13:
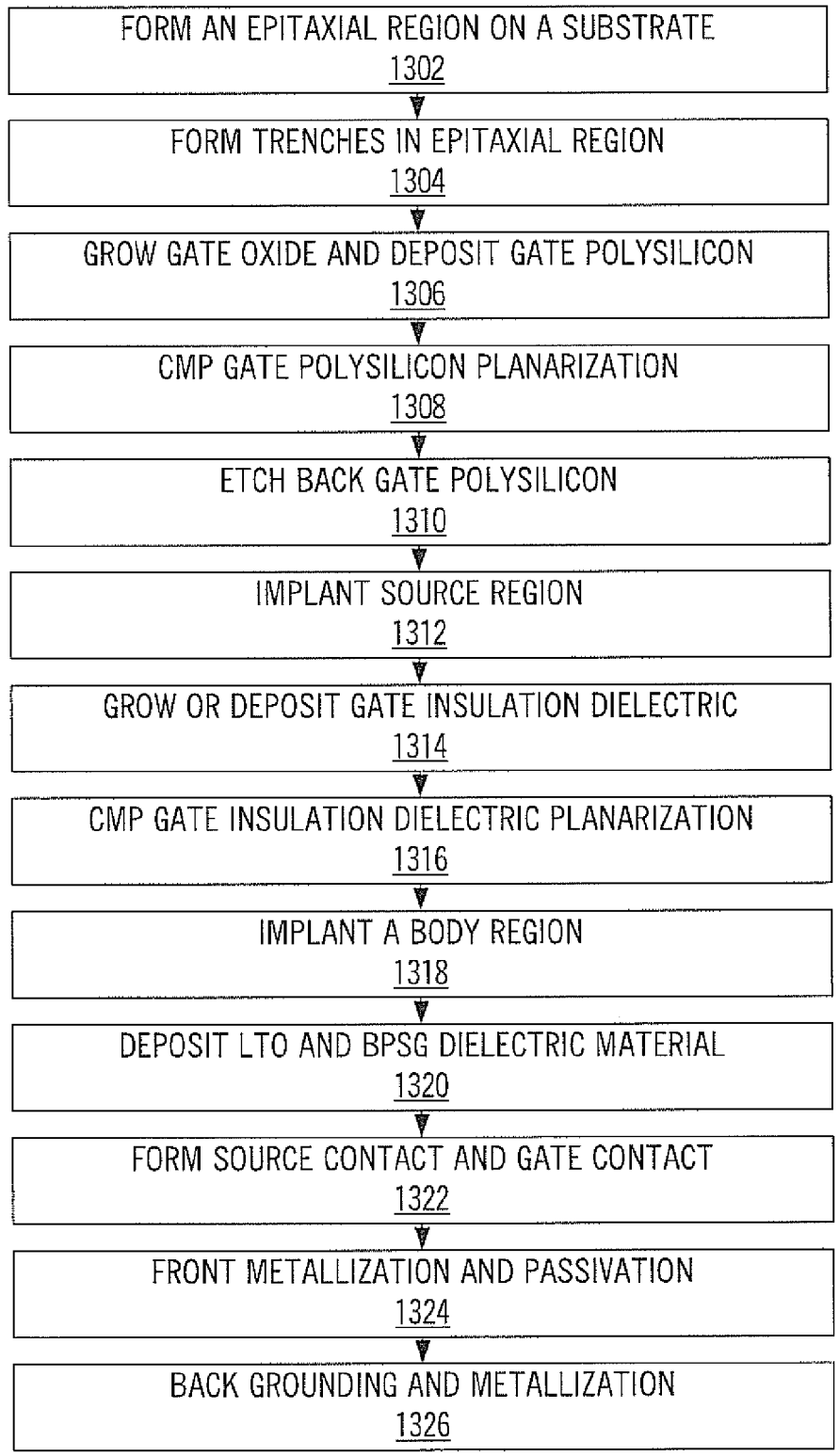
FIG. 13 is a flow diagram of yet another method that includes conventional edge termination in accordance with various embodiments of the invention.

FIG. 13 is a flow diagram of a method 1300 in accordance with various embodiments of the invention for fabricating a super-high density trench MOSFET. For example, method 1300 can include forming an epitaxial region on a substrate. Additionally, trenches can be formed or etched into the epitaxial region as part of a vertical MOSFET. Gate oxide can be grown and gate polysilicon can be deposited within the trenches. Moreover, chemical mechanical polishing can be performed on the gate polysilicon. In addition, method 1300 can include etching back the gate polysilicon. One or more source regions can be implanted into the future body region. Dielectric material can be grown or deposited over the gate polysilicon and within the one or more trenches. Furthermore, chemical mechanical polishing can be performed on the dielectric material. A body region can be implanted into the epitaxial region. LTO and BPSG dielectric can be deposited on its top surface. Furthermore, the method 1300 can include etching source and gate contacts. Front metal layer and passivation layer can be formed. Wafer back grounding and metallization can be formed. In this fashion, a super-high density trench MOSFET can be fabricated in accordance with various embodiments of the invention.

At operation 1302 of FIG. 13, an epitaxial region (e.g., 104 or 204) can be formed on a substrate (e.g., 102 or 202). It is pointed out that operation 1302 can be implemented in a wide variety of ways. For example, operation 1302 can be implemented in any manner similar to that described herein, but is not limited to such.

At operation 1304, trenches (e.g., 110 or 210) can be formed or etched into the epitaxial region as part of a vertical MOSFET (e.g., 100 or 200). Note that operation 1304 can be implemented in a wide variety of ways. For example, operation 1304 can be implemented in any manner similar to that described herein, but is not limited to such.

At operation 1306 of FIG. 13, gate oxide (e.g., 112 or 212) can be grown and gate polysilicon (e.g., 114 or 214) can be deposited within the trenches. It is noted that operation 1306 can be implemented in a wide variety of ways. For example, operation 1306 can be implemented in any manner similar to that described herein, but is not limited to such.

At operation 1308, CMP the gate polysilicon in order to substantially planarize it. Note that operation 1308 can be implemented in a wide variety of ways. For example, operation 1308 can be implemented in any manner similar to that described herein, but is not limited to such.

At operation 1310 of FIG. 13, etch back the gate polysilicon. It is noted that operation 1310 can be implemented in a wide variety of ways. For example, operation 1310 can be implemented in any manner similar to that described herein, but is not limited to such.

At operation 1312, one or more source regions (e.g., 108 or 208) can be implanted into the future body region. It is pointed out that operation 1312 can be implemented in a wide variety of ways. For example, operation 1312 can be implemented in any manner similar to that described herein, but is not limited to such.

At operation 1314 of FIG. 13, dielectric material (e.g., 120 or 220) can be grown or deposited over the gate polysilicon and within the one or more trenches. It is pointed out that operation 1314 can be implemented in a wide variety of ways. For example, operation 1314 can be implemented in any manner similar to that described herein, but is not limited to such.

At operation 1316, CMP the gate insulation dielectric material in order to substantially planarize it. Note that operation 1316 can be implemented in a wide variety of ways. For example, operation 1316 can be implemented in any manner similar to that described herein, but is not limited to such.

At operation 1318 of FIG. 13, a body region (e.g., 106 or 206) can be implanted into the epitaxial region. It is noted that operation 1318 can be implemented in a wide variety of ways. For example, operation 1318 can be implemented in any manner similar to that described herein, but is not limited to such.

At operation 1320, LTO and BPSG dielectric can be deposited on its top surface. Note that operation 1320 can be implemented in a wide variety of ways. For example, operation 1320 can be implemented in any manner similar to that described herein, but is not limited to such.

At operation 1322, etch (or form) source and gate contacts. It is noted that operation 1322 can be implemented in a wide variety of ways. For example, operation 1322 can be implemented in any manner similar to that described herein, but is not limited to such.

At operation 1324 of FIG. 13, front metal layer (e.g., 116 or 216 or 512 or 912) and passivation layer (e.g., 514 or 918) can be formed. It is pointed out that operation 1324 can be implemented in a wide variety of ways. For example, operation 1324 can be implemented in any manner similar to that described herein, but is not limited to such.

At operation 1326, wafer back grounding and metallization (e.g., 118) can be formed. Note that operation 1326 can be implemented in a wide variety of ways. For example, operation 1326 can be implemented in any manner similar to that described herein, but is not limited to such. Once operation 1326 is completed, process 1300 can be ended or exited. In this manner, a super-high density trench MOSFET can be fabricated in accordance with various embodiments of the invention.

Figure 14:
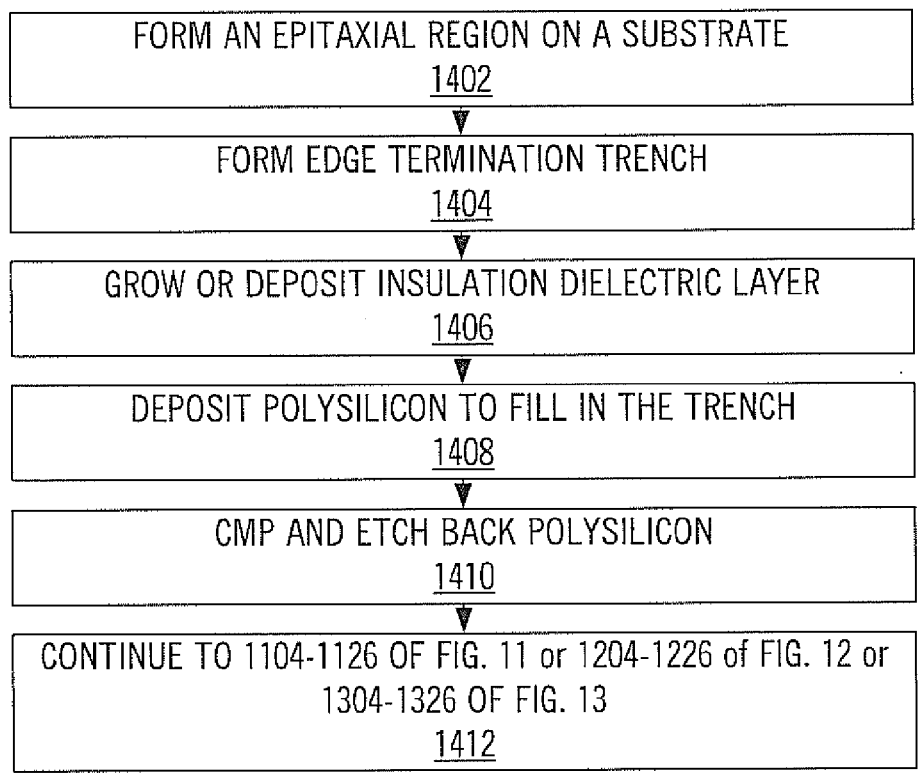
FIG. 14 is a flow diagram of a method for inserting trench edge termination into FIGS. 11-13 in accordance with various embodiments of the invention.

FIG. 14 is a flow diagram of a method 1400 for implementing trench edge termination in accordance with various embodiments of the invention as part of fabricating a super-high density trench MOSFET. For example, method 1400 can include forming an epitaxial region on a substrate. Furthermore, an edge termination trench can be formed or etched into the epitaxial region as part of a vertical MOSFET. In addition, dielectric material can be grown or deposited within the edge termination trench. Additionally, polysilicon can be deposited within the edge termination trench. Moreover, chemical mechanical polishing can be performed on the polysilicon and etching back the polysilicon. After which, process 1400 can be combined with method 1100 (FIG. 11) or method 1200 (FIG. 12) or method 1300 (FIG. 13). For example in various embodiment, process 1400 can continue with operations 1104-1126 of FIG. 11 or operations 1204-1226 of FIG. 12 or operations 1304-1326 of FIG. 13. In this manner, a trench edge termination in accordance with various embodiments of the invention can be implemented as part of fabricating a super-high density trench MOSFET.

At operation 1402 of FIG. 14, an epitaxial region (e.g., 104 or 204) can be formed on a substrate (e.g., 102 or 202). It is pointed out that operation 1402 can be implemented in a wide variety of ways. For example, operation 1402 can be implemented in any manner similar to that described herein, but is not limited to such.

At operation 1404, an edge termination trench (e.g., 802) can be formed or etched into the epitaxial region as part of a vertical MOSFET (e.g., 100 or 200). Note that operation 1404 can be implemented in a wide variety of ways. For example, operation 1404 can be implemented in any manner similar to that described herein, but is not limited to such.

At operation 1406 of FIG. 14, dielectric material (e.g., 804) can be grown or deposited within the edge termination trench. It is pointed out that operation 1406 can be implemented in a wide variety of ways. For example, operation 1406 can be implemented in any manner similar to that described herein, but is not limited to such.

At operation 1408, polysilicon (e.g., 806) can be deposited within the edge termination trench. It is noted that operation 1408 can be implemented in a wide variety of ways. For example, operation 1408 can be implemented in any manner similar to that described herein, but is not limited to such.

At operation 1410 of FIG. 14, CMP the polysilicon and etch back the polysilicon. Note that operation 1410 can be implemented in a wide variety of ways. For example, operation 1410 can be implemented in any manner similar to that described herein, but is not limited to such.

At operation 1412, process 1400 can continue with operations 1104-1126 of FIG. 11 or operations 1204-1226 of FIG. 12 or operations 1304-1326 of FIG. 13. It is pointed out that operation 1412 can be implemented in a wide variety of ways. For example, operation 1412 can be implemented in any manner similar to that described herein, but is not limited to such. In this manner, a trench edge termination in accordance with various embodiments of the invention can be implemented as part of fabricating a super-high density trench MOSFET.

The foregoing descriptions of various specific embodiments in accordance with the invention have been presented for purposes of illustration and description. They are not intended to be exhaustive or to limit the invention to the precise forms disclosed, and many modifications and variations are possible in light of the above teaching. The invention is to be construed according to the Claims and their equivalents.

What is claimed is:

1. A method comprising:
    forming a plurality of trenches in a body region for a vertical metal-oxide semiconductor field-effect transistor (MOSFET);
    growing dielectric material within said plurality of trenches;
    depositing gate polysilicon within said plurality of trenches;
    chemical mechanical polishing said gate polysilicon;
    etching back said gate polysilicon within said plurality of trenches; and
    after said etching back, angle implanting source regions into said body region, a source region contacts both a first trench surface and a second trench surface, said source region is continuous between said first and second trench surfaces.

2. The method of claim 1, further comprising:
    depositing dielectric material over said etched back gate polysilicon; and
    chemical mechanical polishing said dielectric material.

3. The method of claim 2, further comprising:
    self-aligning a source contact over said dielectric material and said source regions.

4. The method of claim 3, wherein said source contact is in contact with at least one of said source regions.

5. The method of claim 1, further comprising:
    forming an epitaxial region on a substrate.

6. The method of claim 5, wherein said epitaxial region is P− and said substrate is P++.

7. The method of claim 5, wherein said epitaxial region is N− and said substrate is N++.

8. A method comprising:
    forming an edge termination trench and a plurality of trenches in an epitaxial region for a vertical metal-oxide semiconductor field-effect transistor (MOSFET);
    growing dielectric material within said edge termination trench and within said plurality of trenches;
    depositing polysilicon within said edge termination trench and within said plurality of trenches;
    chemical mechanical polishing said polysilicon;
    etching back said polysilicon within said edge termination trench and within said plurality of trenches; and
    after said etching back, angle implanting source regions into a body region of said vertical MOSFET, a source region contacts both a first trench surface and a second trench surface, said source region is continuous between said first and second trench surfaces.

9. The method of claim 8, further comprising:
    forming said body region within said epitaxial region, wherein said edge termination trench surrounds said body region.

10. The method of claim 8, further comprising:
    forming an epitaxial region on a substrate.

11. The method of claim 8, wherein said source region contacts said dielectric material within a first trench.

12. The method of claim 8, further comprising:
    depositing dielectric material over said etched back polysilicon; and
    chemical mechanical polishing said dielectric material.

13. The method of claim 12, further comprising:
    depositing a low temperature oxide (LTO) and borophosphosilicate glass (BPSG) above said dielectric material.

14. The method of claim 12, further comprising:
    self-aligning a source contact over said dielectric material and said source regions.

15. The method of claim 14, wherein said source contact is in contact with at least one of said source regions.

* * * * *